United States Patent
Yoshitomi et al.

(10) Patent No.: US 8,268,642 B2
(45) Date of Patent: Sep. 18, 2012

(54) METHOD FOR REMOVING ELECTRICITY AND METHOD FOR MANUFACTURING SEMICONDUCTOR DEVICE

(75) Inventors: Shuhei Yoshitomi, Kanagawa (JP); Masashi Tsubuku, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/893,541

(22) Filed: Sep. 29, 2010

(65) Prior Publication Data

US 2011/0081747 A1 Apr. 7, 2011

(30) Foreign Application Priority Data

Oct. 5, 2009 (JP) ................................. 2009-231612

(51) Int. Cl.
*H01L 21/00* (2006.01)
*H01L 21/66* (2006.01)
*H01L 51/40* (2006.01)
*H01L 21/31* (2006.01)
*H01L 21/469* (2006.01)

(52) U.S. Cl. ............. 438/10; 438/17; 438/99; 438/149; 438/799; 257/E51.005; 257/E29.151; 257/E21.333; 257/E29.002

(58) Field of Classification Search ..................... 438/10, 438/17, 99, 149, 799; 257/E51.005, E29.151, 257/E21.333, E29.002
See application file for complete search history.

(56) References Cited

U.S. PATENT DOCUMENTS

| | | | | |
|---|---|---|---|---|
| 4,325,183 | A | * | 4/1982 | Khambatta .................... 29/621 |
| 5,480,728 | A | * | 1/1996 | Tkaczyk ....................... 428/548 |
| 5,731,856 | A | | 3/1998 | Kim et al. |
| 5,744,864 | A | | 4/1998 | Cillessen et al. |
| 6,294,274 | B1 | | 9/2001 | Kawazoe et al. |

(Continued)

FOREIGN PATENT DOCUMENTS

EP 1 737 044 A1 12/2006

(Continued)

OTHER PUBLICATIONS

International Search Report, PCT Application No. PCT/JP2010/066269, dated Nov. 22, 2010, 3 pages.

(Continued)

*Primary Examiner* — Michelle Mandala
(74) *Attorney, Agent, or Firm* — Fish & Richardson P.C.

(57) ABSTRACT

An object is to suppress a significant change in electrical characteristics of thin film transistors and a deviation thereof from the designed range due to static electricity, and to improve the yield in manufacturing semiconductor devices. In order to prevent a substrate from being charged with static electricity by heat treatment or to favorably reduce static electricity with which a substrate is charged in a manufacturing process of a semiconductor device, heat treatment is performed with a substrate provided with a thin film transistor stored in a conductive container. In addition, a heating apparatus for performing the heat treatment is electrically connected to a ground potential, and the container and the substrate are also electrically connected to the ground potential.

9 Claims, 20 Drawing Sheets

U.S. PATENT DOCUMENTS

| | | | |
|---|---|---|---|
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0085938 | A1* | 4/2007 | Yamazaki et al. ............. 349/43 |
| 2007/0090365 | A1 | 4/2007 | Hayashi et al. |
| 2007/0108446 | A1 | 5/2007 | Akimoto |
| 2007/0132921 | A1* | 6/2007 | Yoon ............................ 349/107 |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0110491 | A1* | 5/2008 | Buller et al. .................. 136/249 |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Covan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2000-340643 A | 12/2000 |
| JP | 2001-004282 A | 1/2001 |
| JP | 2001-057371 A | 2/2001 |
| JP | 2001-151524 A | 6/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | 2004/114391 A1 | 12/2004 |

OTHER PUBLICATIONS

Written Opinion, PCT Application No. PCT/JP2010/066269, dated Nov. 22, 2010, 4 pages.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at RoomTemperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.
Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZNO TFTS) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancles in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214TH ECS Meeting, 2008, No. 2317, 1 page.
Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUs on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13TH International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "Suftla Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6TH International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3-Ga2ZnO4-ZnO system at 1350°C," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics letters), Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09: SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16TH International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08: Proceedings of the 15TH International Display Workshops, Dec. 3, 2008, pp. 1637-1640.

Tsuda, K et al., "Ultra Low Power Consumption Technologies for Mobile TFT-LCDs," IDW '02 : Proceedings of the 9TH International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

METHOD FOR REMOVING ELECTRICITY AND METHOD FOR MANUFACTURING SEMICONDUCTOR DEVICE

TECHNICAL FIELD

The present invention relates to a method for removing static electricity in a manufacturing plant where semiconductor devices are manufactured. The present invention also relates to a method for manufacturing a semiconductor device which has a circuit including a thin film transistor (hereinafter referred to as a TFT). For example, the present invention relates to electronic devices which are mounted with electro-optical devices typified by liquid crystal display panels, or light emitting display devices including an organic light emitting element, as a component.

In this specification, a semiconductor device generally means a device which can function by utilizing semiconductor characteristics, and an electro-optical device, a semiconductor circuit, and an electronic device are all semiconductor devices.

BACKGROUND ART

In a manufacturing plant where semiconductor devices are manufactured, in a manufacturing process of, for example, semiconductor elements, ICs, liquid crystal panels, magnetic heads, or the like, static electricity may adversely affect electronic circuits and cause a change in electrical characteristics or damage to circuits. In addition, there is also a problem in that static electricity causes dust to be easily attached to products.

In particular, in the case of using an insulating substrate, electrostatic charging tends to occur, and the insulating substrate is formed of a material which is easily charged with static electricity, such as glass or a resin.

In recent years, a technique for forming a thin film transistor (TFT) using a semiconductor thin film (having a thickness of several nanometers to several hundred nanometers) formed over a glass substrate has attracted attention. Thin film transistors are applied to a wide range of electronic devices such as ICs or electro-optical devices, and thin film transistors that are used as switching elements in image display devices are particularly developed urgently.

In addition, in a manufacturing process of liquid crystal panels which are a typical example of image display devices, a reduction in thickness of glass by a reduction in weight, and an improvement in productivity by an increase in size of a glass substrate have been attempted.

There are various kinds of metal oxides, which are used for a wide range of applications. Indium oxide is a well-known material and is used as a light transmitting electrode material which is needed for liquid crystal displays and the like. Some metal oxides have semiconductor characteristics. Examples of such metal oxides having semiconductor characteristics include tungsten oxide, tin oxide, indium oxide, and zinc oxide. Thin film transistors in each of which such a metal oxide having semiconductor characteristics is used for a channel formation region have already been known (Patent Documents 1 and 2).

REFERENCES

[Patent Document 1] Japanese Published Patent Application No. 2007-123861
[Patent Document 2] Japanese Published Patent Application No. 2007-96055

DISCLOSURE OF INVENTION

A significant change in electrical characteristics of thin film transistors and a deviation thereof from the designed range due to static electricity can be suppressed, and the yield in manufacturing semiconductor devices can be improved.

An object of an embodiment of the present invention is to prevent a substrate from being charged with static electricity in a manufacturing process of a semiconductor device.

Another object is to favorably reduce static electricity with which a substrate is charged in a manufacturing process of a semiconductor device.

Another object is to prevent a circuit inside a semiconductor device from being damaged by static electricity.

There are two methods for preventing charging: a method of preventing the generation of static electricity and a method of leaking generated charges.

In order to prevent the generation of static electricity, a conductive storage container for storing a glass substrate provided with a thin film transistor is used. A tray body formed from a conductive material and a tray cover formed form a conductive material are used, and a glass substrate provided with a thin film transistor is placed over the tray body, and then, the tray cover is further placed thereover such that the whole glass substrate is stored therein. One of the opposing surfaces of the tray body and the tray cover has a depressed portion which has a larger area than the glass substrate. Alternatively, a box storage container having an opening and closing cover may be used. Materials of the tray body and the tray cover are not limited to particular materials as long as they are conductive materials. Aluminum, copper, titanium, molybdenum, tungsten, niobium, or the like can be used.

In addition, the storage container is not limited to a hollow airtight container for storing a substrate in an enclosed space and may have an opening. A glass substrate provided with a thin film transistor may be stored in a container formed using a conductive material and having a quadrangular prism or cylindrical shape.

Then, the glass substrate stored in any one of these storage containers is heated at 100° C. to 300° C. by a heating apparatus using dry air, dry nitrogen, or dry oxygen. The storage container prevents the glass substrate from being directly exposed to a wind and prevents the generation of static electricity as much as possible. In addition, by performing heating while the storage container which is in contact with the substrate and the heating apparatus are being connected to a ground potential, the amount of electricity with which the substrate is charged can be gradually decreased. In the case where the storage container which is in contact with the substrate and the heating apparatus are connected to a ground potential, a shelf provided in the heating apparatus (a shelf in contact with the storage container), the inner wall of the heating apparatus, and the like are electrically connected, and furthermore, an escape route for static electricity to flow from the inner wall of the heating apparatus to a conductive floor, specifically, a stainless steel floor, is formed. By electrical connection to a ground potential, a change in electrical characteristics of a thin film transistor or damage thereto due to static electricity can be prevented, and product yield can be improved.

An embodiment of the present invention disclosed in this specification is an method for removing electricity, in which charges in a thin film transistor or in the vicinity thereof are reduced by suppressing the presence of static charges at a surface of a substrate provided with a thin film transistor, or suppressing the generation of static charges which is caused by wind, and by heating the substrate to transfer internal charges to an atmosphere over the substrate and holding the atmosphere.

With the above structure, at least one of the above objects can be achieved.

In addition, an embodiment of the present invention is a method for removing electricity, in which charges in a thin film transistor or in the vicinity thereof are reduced by placing a substrate provided with the thin film transistor in a conductive container and performing heat treatment to suppress the presence of static charges at a surface of the substrate provided with the thin film transistor or suppress the generation of static charges which is caused by wind.

In an active matrix display device, it is preferable that a channel be formed with a gate voltage of a thin film transistor being a positive threshold voltage which is as close to 0 V as possible.

In the case of an n-channel thin film transistor, it is preferable that a channel be formed and a drain current begin to flow only after a positive voltage is applied as a gate voltage. A transistor in which a channel is not formed unless the driving voltage is set high and a transistor in which a channel is formed and a drain current flows even in the case of the negative voltage state are not suitable for a thin film transistor used in a circuit.

In addition, a thin film transistor formed using an oxide semiconductor layer has a possibility that electrical characteristics of the thin film transistor may significantly change and deviate from the designed range by the influence of static electricity. In particular, if the threshold voltage of the thin film transistor is negative, the thin film transistor tends to be normally on; in other words, a current tends to flow between a source electrode and a drain electrode even when the gate voltage is 0 V. In addition, a thin film transistor formed using an oxide semiconductor layer has the problem of channel length dependence; for example, the thin film transistor is normally on when having a short channel length or is normally off when having a long channel length, even in the case of having the same structure.

In order to solve the problem of channel length dependence, a thin film transistor is manufactured and then placed in a conductive storage container and subjected to heating at 100° C. to 300° C. As a result, a thin film transistor which has a positive threshold voltage and is normally off even in the case of having a short channel length can be manufactured. Note that the timing of heating is not particularly limited as long as it is after the thin film transistor is manufactured. In the case of manufacturing a liquid crystal panel, a substrate provided with a thin film transistor and a pixel electrode may be placed in a conductive storage container and subjected to heating at 100° C. to 300° C. before being attached to a counter substrate.

In addition, an embodiment of the present invention regarding a method for manufacturing a semiconductor device is a method for manufacturing a semiconductor device, which includes the steps of forming a thin film transistor including an oxide semiconductor layer over a substrate, and performing heat treatment with the substrate provided with the thin film transistor stored in a conductive container.

In addition, a feature of the above structure is that a heating apparatus for performing the heat treatment is electrically connected to a ground potential and the container is also electrically connected to the ground potential.

Alternatively, instead of the storage container, a conductive sheet, for example, metal foil (such as aluminum, copper, titanium, molybdenum, tungsten, or niobium) may be wrapped around a glass substrate provided with a thin film transistor to prevent the generation of static electricity. Still alternatively, foil of an alloy thereof (e.g., foil of bimetal of aluminum and copper) may be used.

In addition, another embodiment of the present invention is a method for removing electricity, in which charges in a thin film transistor or in the vicinity thereof are reduced by wrapping a substrate provided with the thin film transistor in metal foil and performing heat treatment to suppress the presence of static charges at a surface of the substrate provided with the thin film transistor or suppress the generation of static charges which is caused by wind or the like.

Another embodiment of the present invention disclosed in this specification is a method for manufacturing a semiconductor device, which includes the steps of forming a thin film transistor including an oxide semiconductor layer over a substrate, and performing heat treatment with the substrate provided with the thin film transistor wrapped in conductive metal foil. Note that the temperature of the heat treatment is 100° C. to 300° C.

In addition, a feature of the above structure is that a heating apparatus for performing the heat treatment is electrically connected to a ground potential and the metal foil is also electrically connected to the ground potential. Note that the heating apparatus for performing the heat treatment may be electrically connected to a fixed potential instead of the ground potential. By suppressing static charges, electric charges in the thin film transistor or in the vicinity thereof can be reduced. In addition, the metal foil may also be electrically connected to a fixed potential instead of the ground potential.

Note that when two objects are rubbed together, placed in contact with each other, or separated from each other, one is positively charged and the other is negatively charged, and static electricity refers to electric charges thereof. A phenomenon in which electrons are transferred between two objects due to friction or the like and charges are generated is referred to as charging. When charging occurs, in the case where a material of the object is an insulator, generated charges do not flow and are accumulated as static electricity.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is simply called a potential or a voltage, and a potential and a voltage are used as synonymous words in many cases. Thus, in this specification, a potential may be rephrased as a voltage and a voltage may be rephrased as a potential unless otherwise specified.

A significant change in electrical characteristics of thin film transistors and a deviation thereof from the designed range due to static electricity can be suppressed, and the yield in manufacturing semiconductor devices can be improved. In addition, in a manufacturing process of a semiconductor device, a substrate can be prevented from being charged with static electricity. Furthermore, static electricity with which a substrate is charged in a manufacturing process of a semiconductor device can be favorably reduced.

BRIEF DESCRIPTION OF DRAWINGS

FIGS. 8A1, 8A2, and 8B are top views and a cross-sectional view illustrating an embodiment of the present invention.

BEST MODE FOR CARRYING OUT THE INVENTION

Embodiments of the present invention will be described below in detail with reference to the accompanying drawings. Note that the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments given below.

Embodiment 1

In this embodiment, heat treatment with a substrate surrounded using a tray body and a tray cover will be described below.

Figure 1A:
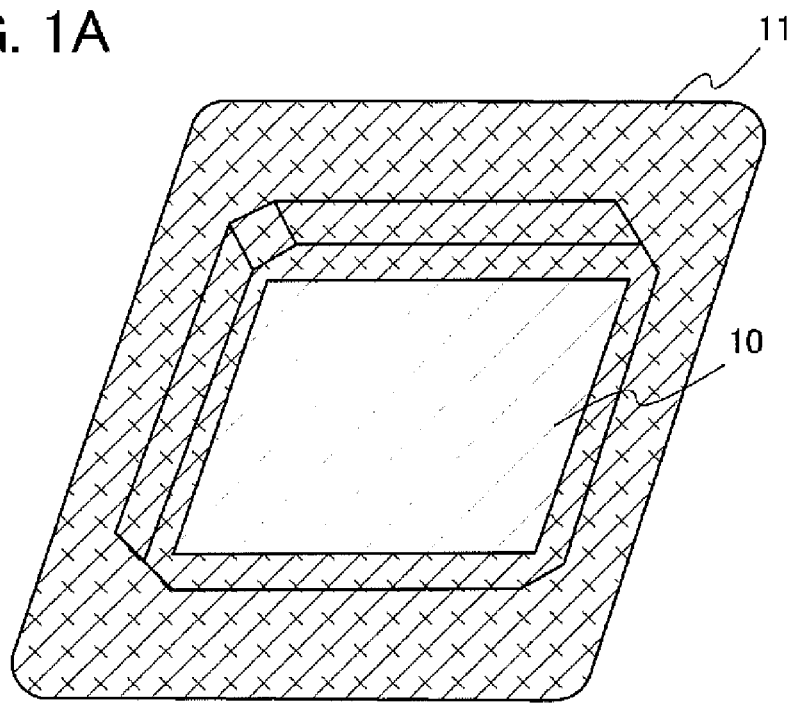
FIGS. 1A and 1B are an external view and a cross-sectional view illustrating an embodiment of the present invention.

FIG. 1A is an external view illustrating a state in which a substrate 10 is placed in a depressed portion of a tray body 11.

The substrate 10, for which a glass substrate or the like is used, is provided with a circuit including a thin film transistor on one side. Note that the shape of the substrate 10 is not particularly limited to a quadrangular shape and may be a circular shape or the like, for example.

The tray body 11 is formed using a conductive material such as aluminum, copper, titanium, molybdenum, tungsten, or niobium. In this embodiment, aluminum is used.

Figure 1B:
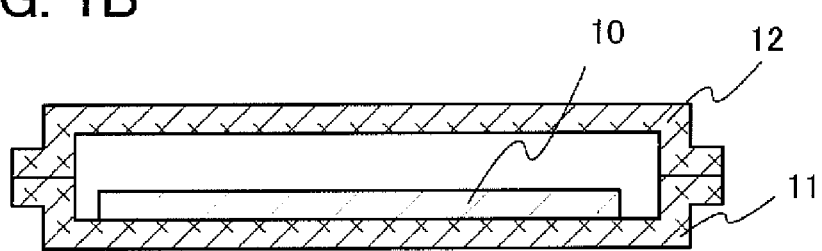

Then, a tray cover 12 is placed so as to overlap the tray body 11 such that the substrate 10 is surrounded as shown in a cross-sectional view of FIG. 1B. Then, the peripheral portion of the tray body 11 and the tray cover 12 is hermetically sealed with kapton tape or the like so as not to leave a space. Note that the tray cover 12 is also formed using a conductive material such as aluminum, copper, titanium, molybdenum, tungsten, or niobium. The tray cover 12 is used in order to prevent the substrate from being exposed to a wind during heat treatment which is performed later, and instead of the tray cover 12, metal foil may be used such that the substrate is placed in a closed space.

Next, the substrate in the state as shown in FIG. 1B is brought into a heating apparatus and subjected to heat treatment.

Figure 2:
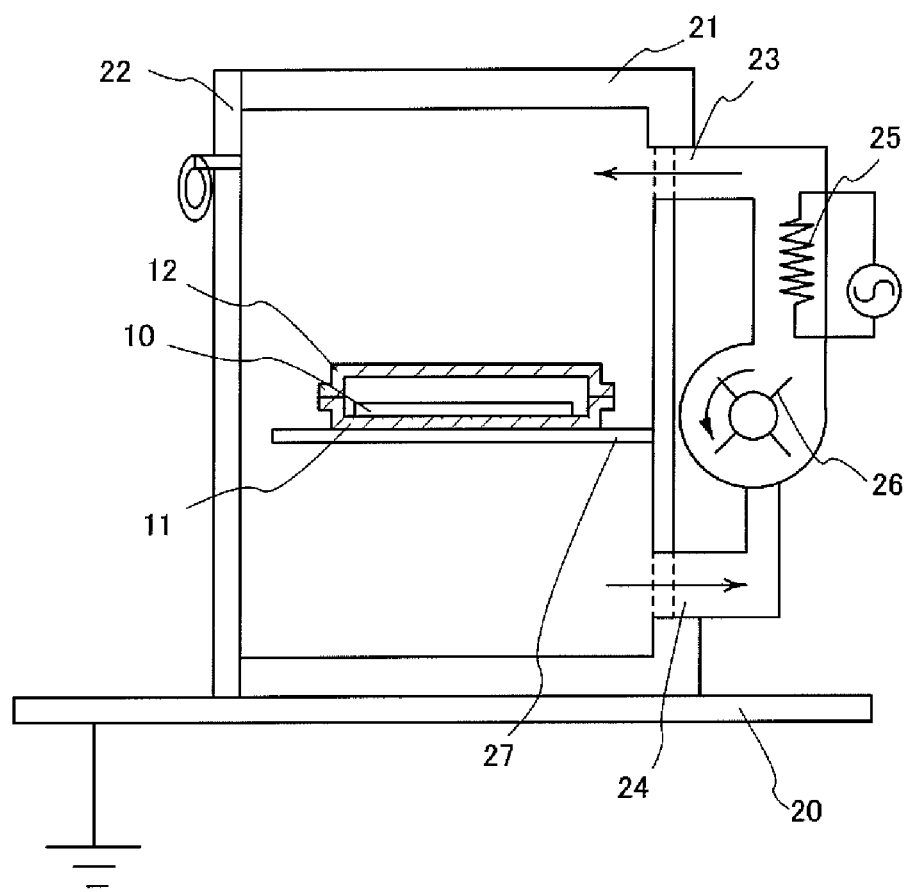
FIG. 2 is a cross-sectional view illustrating an embodiment of the present invention.

FIG. 2 shows a cross-sectional view of a hot air circulation type heating apparatus. Note that a structure of the heating apparatus shown in FIG. 2 is an example, and the present invention is not particularly limited thereto. This hot air circulation type is capable of performing heating in a large space with hot air and is also suitable for heating a large-sized substrate which has a side longer than 1 m and which is used as the substrate 10.

A furnace body 21 of the heating apparatus is formed in a vertically long rectangular cuboidal shape with a structure in which a space between an outer metal frame and an inner metal frame is filled with a heat insulating material, and has a door 22 on one side. In addition, an outlet 23 and an inlet 24 for hot air are provided on one inner side wall of the furnace body 21.

From the outlet 23 for hot air, an air heated by a heater 25 and moved by a fan 26 is supplied into the furnace as hot air.

This hot air is used to heat the tray body 11 and the tray cover 12 in which the substrate 10 that is an object to be treated is stored, and is drawn into an exhaust air passage through the inlet 24 and circulated again by the fan 26.

It is preferable that the tray in which the substrate is stored so as not to be exposed to the hot air be placed on a shelf 27 which is formed using a conductive material.

In addition, the heating apparatus is installed on a floor 20 which is made of stainless steel and which is electrically connected to a ground potential, and the floor 20 of stainless steel and the shelf 27 are electrically connected to each other. Because the tray placed on and in contact with the shelf 27 is also formed using a conductive material, the tray is also electrically connected to the ground potential.

A plurality of substrates each provided with a bottom-gate thin film transistor including an oxide semiconductor layer was manufactured and experimented on. Electrical characteristics obtained when a substrate was placed in a space closed with the tray cover 12 and then heated are compared with electrical characteristics obtained as a comparative example when a substrate was placed without a tray cover and then heated.

The thin film transistors have a channel width W of 50 μm and varying channel lengths L, and are compared with each other to determine channel length dependence. The channel lengths L are 2 μm, 3 μm, 4 μm, 6 μm, 10 μm, 15 μm, 20 μm, and 50 μm.

In order to measure initial characteristics of the thin film transistors, the changing characteristics of the source-drain current (hereinafter referred to as a drain current or Id) were measured, under the conditions where the substrate temperature was set to room temperature, the voltage between source and drain (hereinafter, a drain voltage or Vd) was set to 10 V, and the voltage between source and gate (hereinafter, a gate voltage or Vg) was changed from −20 V to +20 V. In other words, Vg-Id characteristics were measured.

Figure 16:
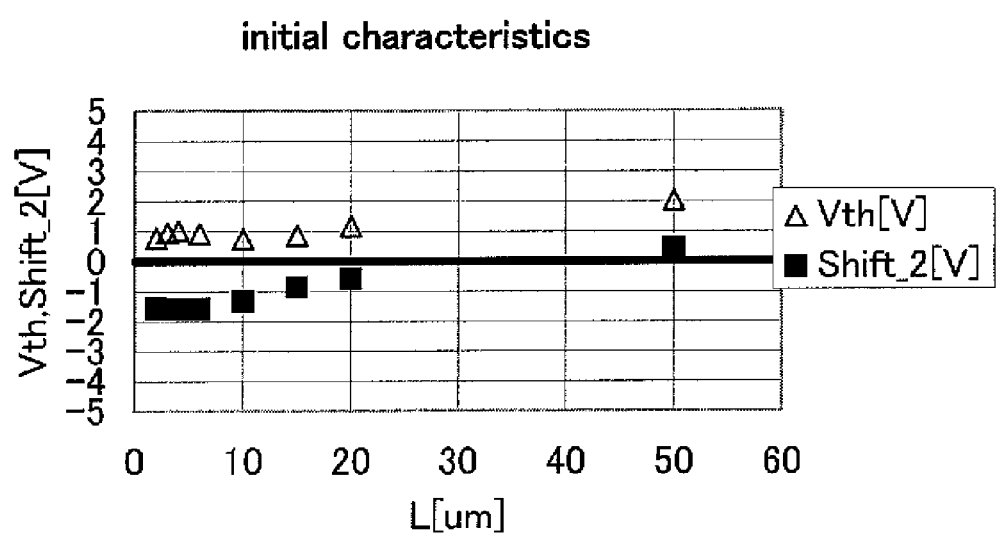
FIG. 16 is a graph showing channel length dependence of a comparative example (initial characteristics).

Then, threshold voltages and voltages (Shift-2) at rising points of Vg-Id curves with a Vd of 10 V were calculated from the Vg-Id characteristics, and FIG. 16 is a graph showing channel length dependence of initial characteristics, where these values are plotted on the vertical axis and the channel lengths are plotted on the horizontal axis.

In FIG. 16, the threshold voltages are positive, but the voltages at rising points of the Vg-Id curves of the samples having channel lengths L of 20 μm or less are negative. Note that Shift-2 refers to a voltage where Id decreasing along the Vg-Id curve as Vg decreases first becomes $1\times10^{-12}$ A with a Vd of 10 V.

Figure 17:
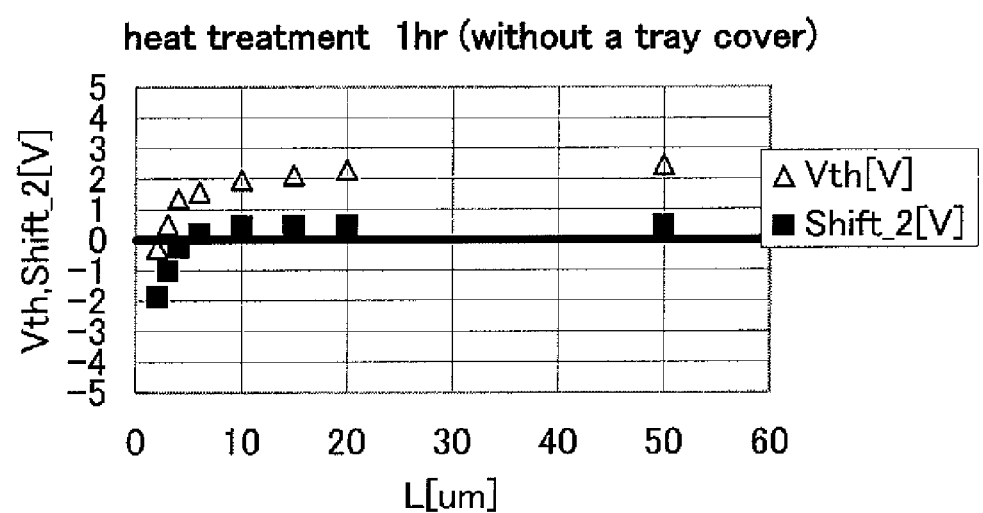
FIG. 17 is a graph showing channel length dependence of a comparative example.
Figure 18:
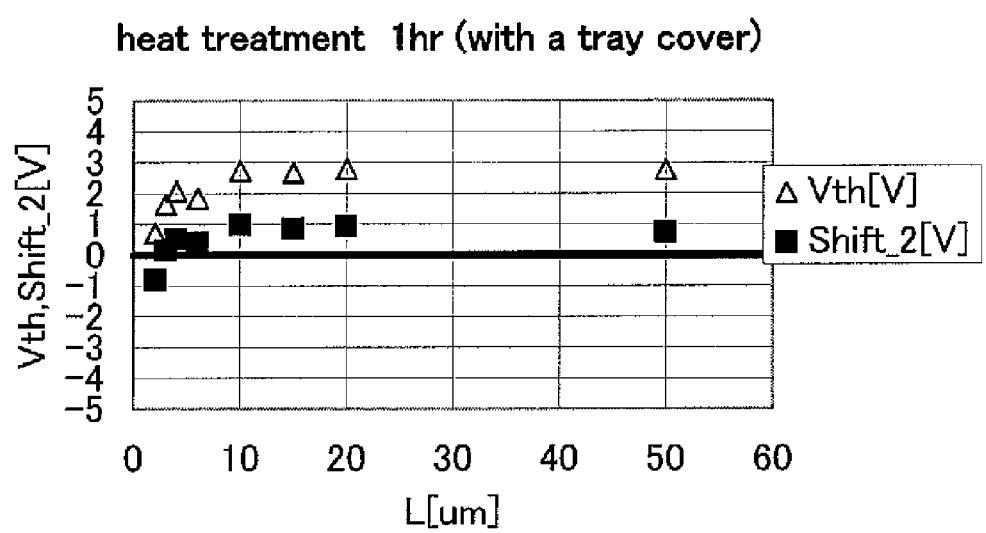
FIG. 18 is a graph showing channel length dependence.

In addition, FIGS. 17 and 18 are graphs showing channel length dependence obtained after heat treatment was performed at 150° C. for one hour using the heating apparatus shown in FIG. 2. FIG. 17 is a graph of channel length dependence obtained in the case where heat treatment was performed without a tray cover. FIG. 18 is a graph of channel length dependence obtained in the case where heat treatment was performed with a tray cover.

In the case of the samples of FIG. 17 which are comparative examples, the substrate is placed and heated without a tray cover, and is therefore directly exposed to hot air. In FIG. 17, as compared to FIG. 16 showing the initial characteristics, the threshold voltage of the sample having a channel length of 2 μm is shifted to a value greater than or equal to zero. In addition, the values of Shift-2 of the samples having channel lengths of 6 μm or more are shifted to values smaller than or equal to zero.

On the other hand, the threshold voltage of the sample having a channel length of 2 μm in FIG. 18 where the substrate is heated with a tray cover remains greater than or equal to zero and is substantially equal to the value in FIG. 16 showing the initial characteristics. In addition, the values of Shift-2 of the samples having channel lengths of 3 μm or more are shifted to values greater than or equal to zero.

Figure 19:
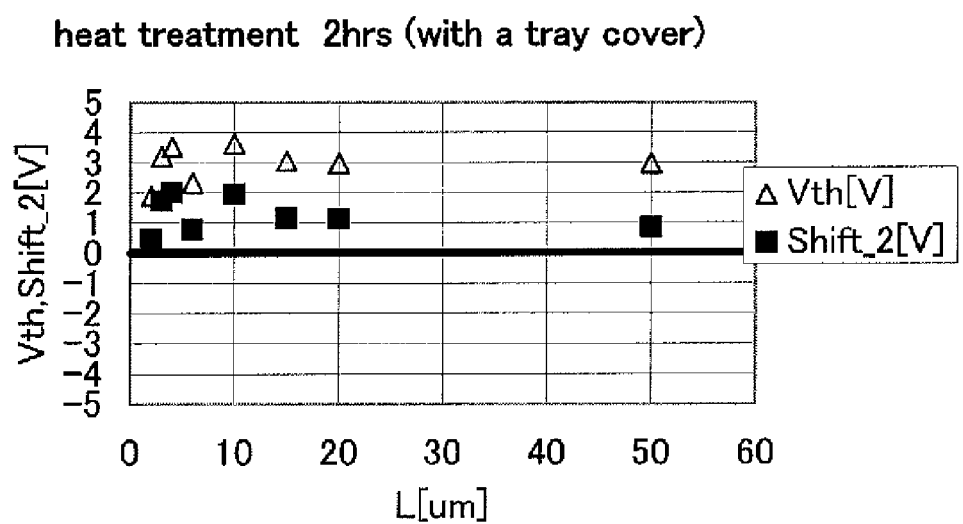
FIG. 19 is a graph showing channel length dependence.

FIG. 19 is a graph showing channel length dependence obtained after the substrate was subjected to heat treatment at 150° C. for two hours with a tray cover. By extending the heat treatment time, the value of Shift-2 of the sample having a channel length of 2 μm is also shifted to a value greater than or equal to zero. The thin film transistors of the samples shown in FIG. 19 can all be regarded as normally off thin film transistors.

Figure 20A:
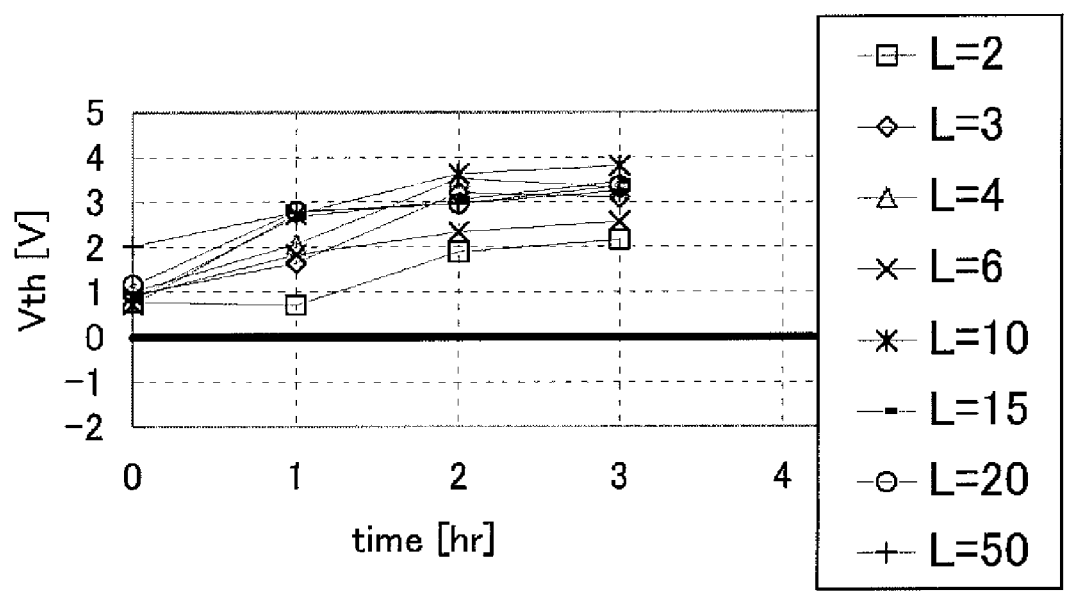
FIGS. 20A and 20B are graphs showing the relationship between channel length dependence and time.
Figure 20B:
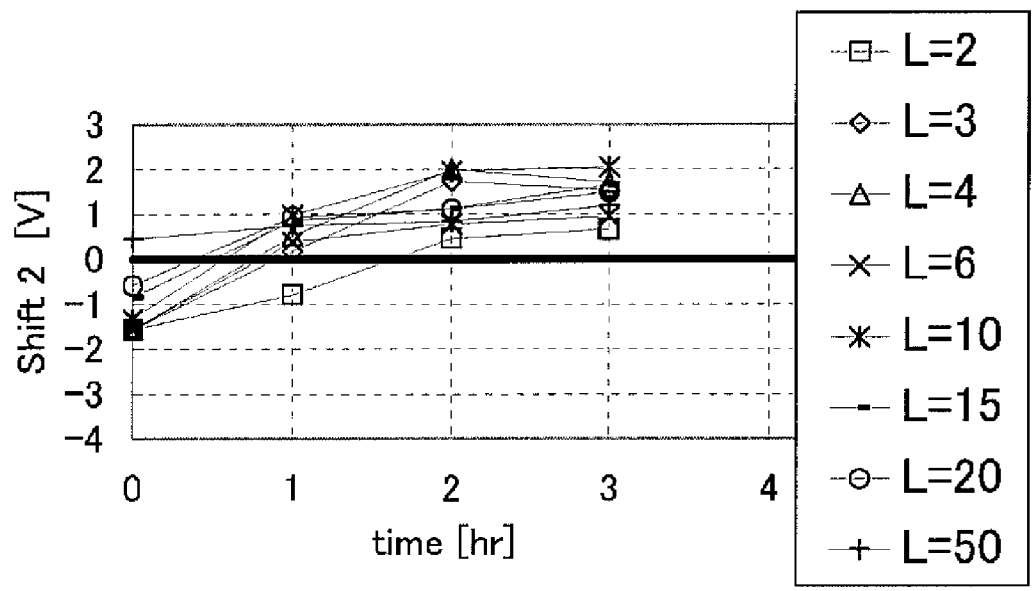

In addition, in the case where the substrate was subjected to heat treatment at 150° C. for three hours with a tray cover, a similar effect was obtained. Note that FIG. 20A is a graph where the horizontal axis represents the time of heat treatment at 150° C. and the vertical axis represents the threshold voltage (Vth) of a thin film transistor. In addition, FIG. 20B is a graph where the horizontal axis represents the time of heat treatment at 150° C. and the vertical axis represents Shift-2 of a thin film transistor. Note that data in FIGS. 20A and 20B are partly identical to those shown in FIGS. 18 and 19. From the results of FIGS. 20A and 20B, it can be said that heat treatment is preferably performed for at least two hours when the substrate is subjected to heat treatment at 150° C. with a tray cover.

From these results, a bottom-gate thin film transistor including an oxide semiconductor layer can be changed so as to have normally off electrical characteristics regardless of the channel length, by being subjected to heat treatment without being exposed to hot air. In addition, a normally off thin film transistor can be stably manufactured by being subjected to heat treatment without being exposed to hot air, which leads to an improvement in yield.

Figure 15:
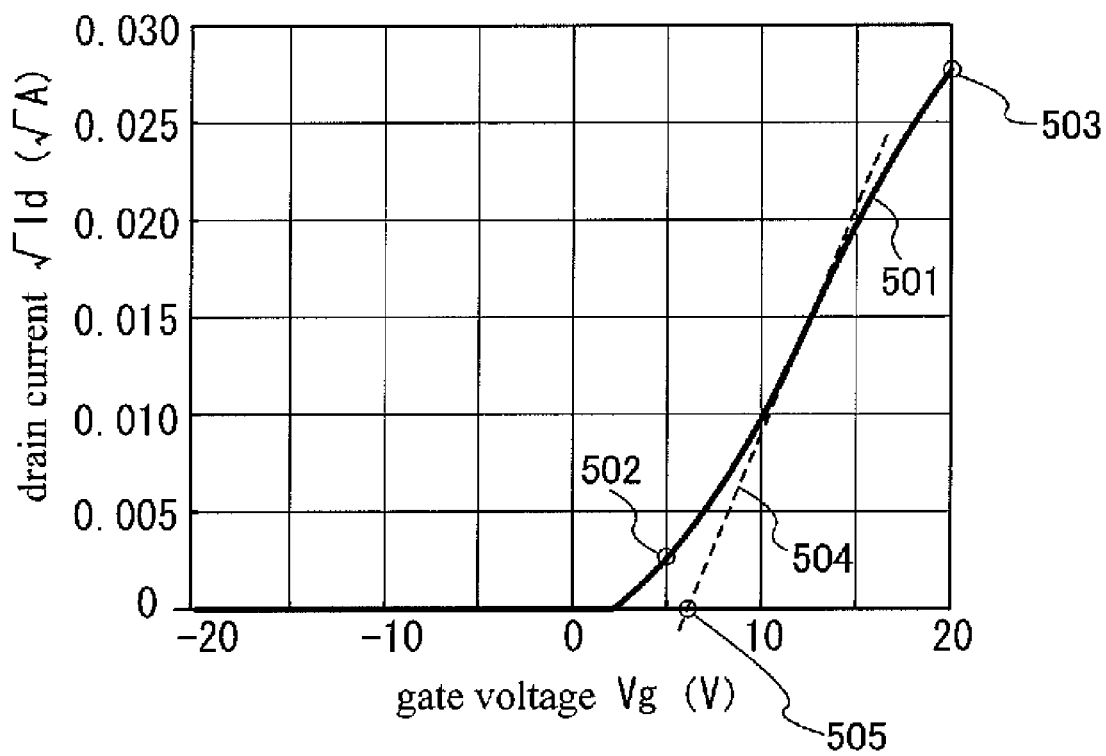
FIG. 15 is a diagram illustrating definition of Vth.

Definition of Vth in this specification is described below. In FIG. 15, gate voltage is plotted on a linear scale on the horizontal axis, and a square root of drain current (hereinafter also referred to as √Id) is plotted on a linear scale on the vertical axis. A curve 501 represents a square root of drain current with respect to a change in gate voltage and shows Id of a Vg-Id curve obtained by setting Vd to 10 V with its square root (such a Vd-Id curve is hereinafter also referred to as a √Id curve).

First, a √Id curve (the curve 501) is obtained from the Vg-Id curve obtained by measurement in which Vd is set to 10 V. Then, a tangent line 504 to the √Id curve at a point where the √Id curve has a maximum differential value (at a point where the √Id curve has a maximum slope) is obtained. Then, the tangent line 504 is extended, and Vg at a point where Id is 0 A on the tangent line 504, that is, a value at an intercept 505 of the tangent line 504 and the gate voltage axis is defined as Vth.

In addition, it is preferable to prevent exposure to hot air because it may cause the generation of static electricity. Furthermore, it is acceptable to provide a wind adjusting member, such as a wind blocking plate for adjusting the flow or amount of hot air blowing into the furnace of the heating apparatus illustrated in FIG. 2, in which case careful attention needs to be paid because static electricity may be generated.

In addition, a cooling means may be provided on an air flow passage in the heating apparatus of FIG. 2. Furthermore, a filter for removing dust or the like may be provided on an air flow passage of the heating apparatus of FIG. 2.

A method for manufacturing the thin film transistors of the samples from which the results in the graphs showing channel length dependence are obtained will be described below with reference to FIGS. 3A to 3D.

First, a conductive film is formed over a substrate 100 which is a substrate having an insulating surface, and then a gate electrode layer 101 is provided using a photolithography process with the use of a photomask.

It is preferable that a glass substrate be used as the substrate 100. As a glass substrate used as the substrate 100, a substrate whose strain point is higher than or equal to 730° C. may be used when the temperature of heat treatment to be performed later is high. Further, as a material of the substrate 100, for example, a glass material such as aluminosilicate glass, aluminoborosilicate glass, or barium borosilicate glass is used. Note that by containing a larger amount of barium oxide (BaO) than that of boric oxide, a glass substrate is heat-resistant and of more practical use. Therefore, a glass substrate containing BaO and $B_2O_3$ so that the amount of BaO is larger than that of $B_2O_3$ is preferably used.

Note that a substrate formed of an insulator such as a ceramic substrate, a quartz glass substrate, a quartz substrate, or a sapphire substrate may be used instead of the substrate 100. Alternatively, crystallized glass or the like may be used.

In addition, an insulating layer serving as a base layer may be provided between the substrate 100 and the gate electrode layer 101. The base layer has a function of preventing diffusion of an impurity element from the substrate 100, and can be formed to have a single-layer or stacked structure using one or more of a silicon nitride layer, a silicon oxide layer, a silicon nitride oxide layer, and a silicon oxynitride layer.

A metal conductive layer can be used as the gate electrode layer 101. As a material of the metal conductive layer, an element selected from Al, Cr, Cu, Ta, Ti, Mo, and W, an alloy containing any of these elements as a component, an alloy containing any of these elements in combination, or the like is preferably used. For example, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. Needless to say, the metal conductive layer may have a single-layer structure or a layered structure of two layers or four or more layers.

Next, a gate insulating layer 102 is formed over the gate electrode layer 101.

In this embodiment, the gate insulating layer 102 is formed using a high-density plasma apparatus. Here, a high-density plasma apparatus refers to an apparatus which can realize a plasma density higher than or equal to $1\times10^{11}/cm^3$. For example, plasma is generated by applying a microwave power of 3 kW to 6 kW, and an insulating film is formed.

A monosilane gas ($SiH_4$), nitrous oxide ($N_2O$), and a rare gas are introduced into a chamber as a source gas, and high-density plasma is generated under a pressure of 10 Pa to 30 Pa, so that an insulating film is formed over a substrate having an insulating surface, such as a glass substrate. After that, the supply of a monosilane gas may be stopped, and nitrous oxide ($N_2O$) and a rare gas may be introduced without exposure to the air to perform plasma treatment on a surface of the insulating film. The plasma treatment performed on the surface of the insulating film by introducing nitrous oxide ($N_2O$) and a rare gas is performed at least after the insulating film is formed. The insulating film formed through the above process procedure corresponds to an insulating film whose reliability can be ensured even when the thickness is small, e.g., less than 100 nm.

In forming the gate insulating layer 102, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed by using the high-density plasma apparatus can have uniform thickness, the insulating film has excellent step coverage. Further, as for the insulating film formed by using the high-density plasma apparatus, the thickness of a thin film can be controlled precisely.

The insulating film formed through the above process procedure is greatly different from an insulating film formed using a conventional parallel plate PCVD apparatus. The etching rate of the insulating film formed through the above process procedure is lower than that of the insulating film formed using the conventional parallel plate PCVD apparatus by 10% or more or 20% or more in the case where the etching rates with the same etchant are compared to each other. Thus, it can be said that the insulating film formed using the high-density plasma apparatus is a dense film.

In this embodiment, a silicon oxynitride film (also referred to as SiOxNy (x>y>0)) having a thickness of 100 nm, which is formed using a high-density plasma apparatus, is used as the gate insulating layer 102.

Next, an oxide semiconductor layer having a thickness of 5 nm to 200 nm, preferably 10 nm to 50 nm, is formed over the gate insulating layer 102. Further, the oxide semiconductor layer can be formed by a sputtering method under a rare gas (typically, argon) atmosphere, an oxygen atmosphere, or an atmosphere containing a rare gas (typically, argon) and oxygen.

The oxide semiconductor layer is formed using an In—Ga—Zn—O-based non-single-crystal layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. In this embodiment, the oxide semiconductor layer is formed by a sputtering method using, for example, an In—Ga—Zn—O-based metal oxide target.

Here, an In—Ga—Zn—O-based film having a thickness of 30 nm is formed using a metal oxide target containing In, Ga, and Zn ($In_2O_3:Ga_2O_3:ZnO=1:1:1$ in molar ratio) under conditions where the distance between the substrate and the target is 100 mm, the pressure is 0.6 Pa, and the direct current (DC) power is 0.5 kW, and the atmosphere is an oxygen atmosphere (the proportion of the oxygen flow is 100%).

It is preferable that the relative density of the oxide semiconductor in the metal oxide target is 80% or more, more preferably 95% or more, further preferably 99.9% or more. The impurity concentration in an oxide semiconductor film which is formed using a target having high relative density can be reduced, and thus a thin film transistor having high electrical characteristics and high reliability can be obtained.

Preheat treatment is preferably performed so as to reduce moisture or hydrogen remaining on an inner wall of a sputtering apparatus, on a surface of the target, or in a target material, before the oxide semiconductor film is formed. As the preheat treatment, a method in which the inside of the film formation chamber is heated to 200° C. to 600° C. under reduced pressure, a method in which introduction and exhaust of nitrogen or an inert gas are repeated while the inside of the film formation chamber is heated, and the like can be given. In this case, not water but oil or the like is preferably used as a coolant for the target. Although a certain level of effect can be obtained when introduction and exhaust of nitrogen are repeated without heating, it is more preferable to perform the treatment while the inside of the film formation chamber is heated. After the preheat treatment, the substrate or the sputtering apparatus is cooled, and then the oxide semiconductor film is formed.

In addition, the substrate may be heated to 400° C. to 700° C. during the film formation by a sputtering method.

It is preferable to reduce moisture or the like remaining in the sputtering apparatus with the use of a cryopump before, during, or after the oxide semiconductor film is formed.

The gate insulating layer 102 and the oxide semiconductor film may be formed successively without exposure to the air. By formation without exposure to the air, each interface of the stacked layers can be formed without being contaminated by an atmospheric component or an impurity element floating in the air, such as water or hydrocarbon. Therefore, variation in characteristics of thin film transistors can be reduced.

Figure 3A:
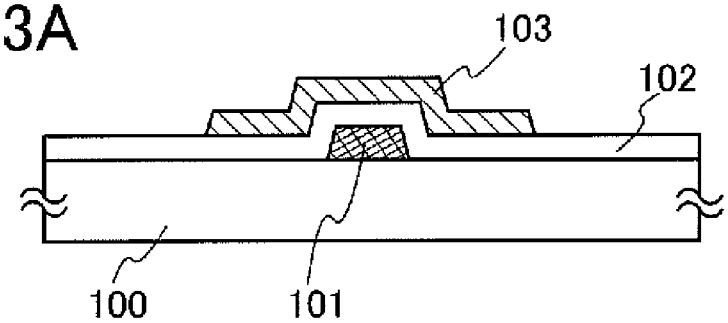
FIGS. 3A to 3D are cross-sectional views illustrating an embodiment of the present invention.

Next, the oxide semiconductor layer is processed into an oxide semiconductor layer 103, which is an island-shaped oxide semiconductor layer, by a photolithography step (see FIG. 3A). A resist mask for forming the island-shaped oxide semiconductor layer may be formed by an ink-jet method. A photomask is not used when the resist mask is formed by an inkjet method, which results in reducing manufacturing cost.

Then, first heat treatment is performed for dehydration or dehydrogenation of the oxide semiconductor layer 103. The highest temperature during the first heat treatment for dehydration or dehydrogenation is set to 350° C. to 750° C., preferably 425° C. or higher. Note that in the case of the temperature that is 425° C. or higher, the heat treatment time may be one hour or shorter, whereas in the case of the temperature lower than 425° C., the heat treatment time is longer than one hour. In this embodiment, heat treatment is performed in a nitrogen atmosphere at 450° C. for one hour.

Note that in the first heat treatment, it is preferable that water, hydrogen, and the like be not contained in nitrogen or a rare gas such as helium, neon, or argon. It is preferable that the purity of nitrogen or the rare gas such as helium, neon, or argon which is introduced into a heat treatment apparatus be set to 6N (99.9999%) or higher, preferably 7N (99.99999%) or higher (that is, the impurity concentration is 1 ppm or lower, preferably 0.1 ppm or lower).

The first heat treatment can be performed using a heating method with the use of an electric furnace. Note that the apparatus for the first heat treatment is not limited to the electric furnace and may be the one provided with a device for heating an object to be treated using heat conduction or heat radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be treated by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be treated by heat treatment, such as nitrogen or a rare gas like argon, is used.

Next, a conductive layer for forming a source electrode layer and a drain electrode layer is formed over the gate insulating layer 102 and the oxide semiconductor layer 103.

The conductive layer for forming a source electrode layer and a drain electrode layer can be formed using a metal conductive layer in a manner similar to that of the gate electrode layer 101. As a material of the metal conductive layer, an element selected from Al, Cr, Cu, Ta, Ti, Mo, and W, an alloy containing any of these elements as a component, an alloy containing any of these elements in combination, or the like is preferably used. In this embodiment, a three-layer stacked structure in which an aluminum layer is stacked over a titanium layer and a titanium layer is stacked over the aluminum layer is employed.

Figure 3B:
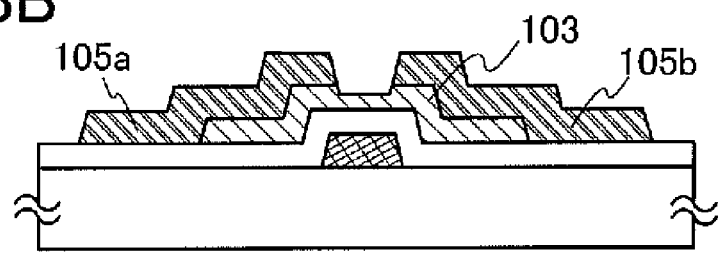

The conductive layer for forming a source electrode layer and a drain electrode layer is subjected to a photolithography process using a photomask, and a source electrode layer 105a and a drain electrode layer 105b are formed (see FIG. 3B). At this time, part of the oxide semiconductor layer 103 is also etched, and thus the oxide semiconductor layer 103 having a groove (depression) is formed. Note that depending on the material of the oxide semiconductor layer 103 or the etching conditions, a groove (depression) is not formed in the oxide semiconductor layer 103 in some cases.

Figure 3C:
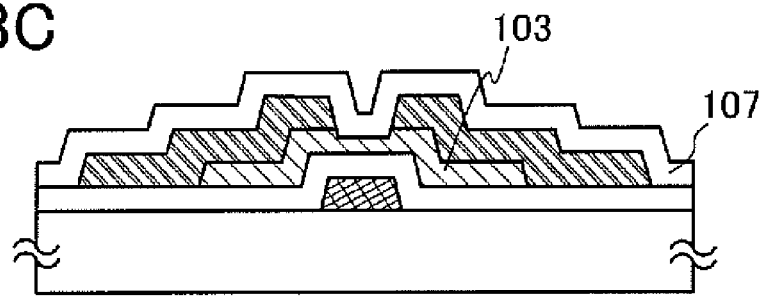

Next, a protective insulating layer 107 which covers the gate insulating layer 102, the oxide semiconductor layer 103, the source electrode layer 105a, and the drain electrode layer 105b and which is in contact with part of the oxide semiconductor layer 103 is formed (see FIG. 3C). The protective insulating layer 107 can be formed to a thickness of at least 1 nm or more using a method by which impurities such as water and hydrogen are prevented from being mixed to the protective insulating layer 107, such as a CVD method or a sputtering method, as appropriate. Here, the protective insulating layer 107 is formed by, for example, a reactive sputtering method which is one kind of sputtering methods. The protective insulating layer 107 which is in contact with part of the oxide semiconductor layer 103 is formed using an inorganic insulating layer which does not contain impurities such as moisture, hydrogen ions, and OH⁻ and prevents entry of these impurities from the outside. Specifically, a silicon oxide layer, a silicon nitride oxide layer, a silicon nitride layer, an aluminum oxide layer, an aluminum oxynitride layer, or an aluminum nitride layer can be used.

Further alternatively, the protective insulating layer 107 may have a structure in which a silicon nitride layer or an aluminum nitride layer is stacked over a silicon oxide layer, a silicon nitride oxide layer, an aluminum oxide layer, or an aluminum oxynitride layer. In particular, the silicon nitride layer is preferable because it does not contain an impurity such as moisture, a hydrogen ion, or OH⁻ and prevents entry thereof from the outside.

The substrate temperature at the time of forming the protective insulating layer 107 may be set in the range of room temperature to 300° C. The silicon oxide layer can be formed by a sputtering method in a rare gas (typically, argon) atmosphere, an oxygen atmosphere, or an atmosphere containing a rare gas (typically, argon) and oxygen. As a target, a silicon oxide target or a silicon target can be used. For example, with the use of a silicon target, a silicon oxide layer can be formed by a sputtering method in an atmosphere containing oxygen and a rare gas. In this embodiment, a silicon oxide film having a thickness of 300 nm is formed using a silicon target.

Figure 3D:
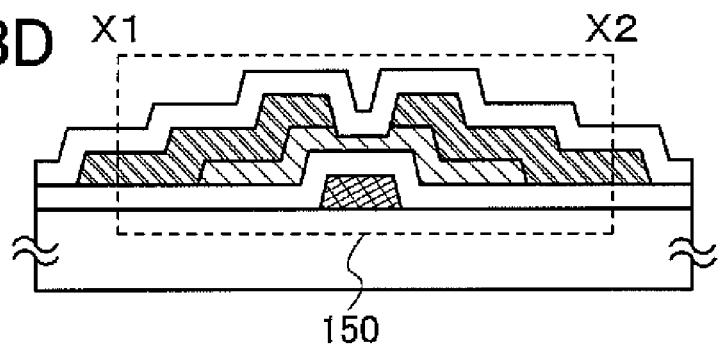

Through the above-described process, a bottom-gate thin film transistor 150 can be formed (see FIG. 3D). In the thin film transistor 150, the gate electrode layer 101 is provided over the substrate 100 which is a substrate having an insulating surface, the gate insulating layer 102 is provided over the gate electrode layer 101, the oxide semiconductor layer 103 is provided over the gate insulating layer 102, the source electrode layer 105a and the drain electrode layer 105b are provided over the oxide semiconductor layer 103, and the protective insulating layer 107 which covers the gate insulating layer 102, the oxide semiconductor layer 103, the source electrode layer 105a, and the drain electrode layer 105b and which is in contact with part of the oxide semiconductor layer 103 is provided.

Figure 4:
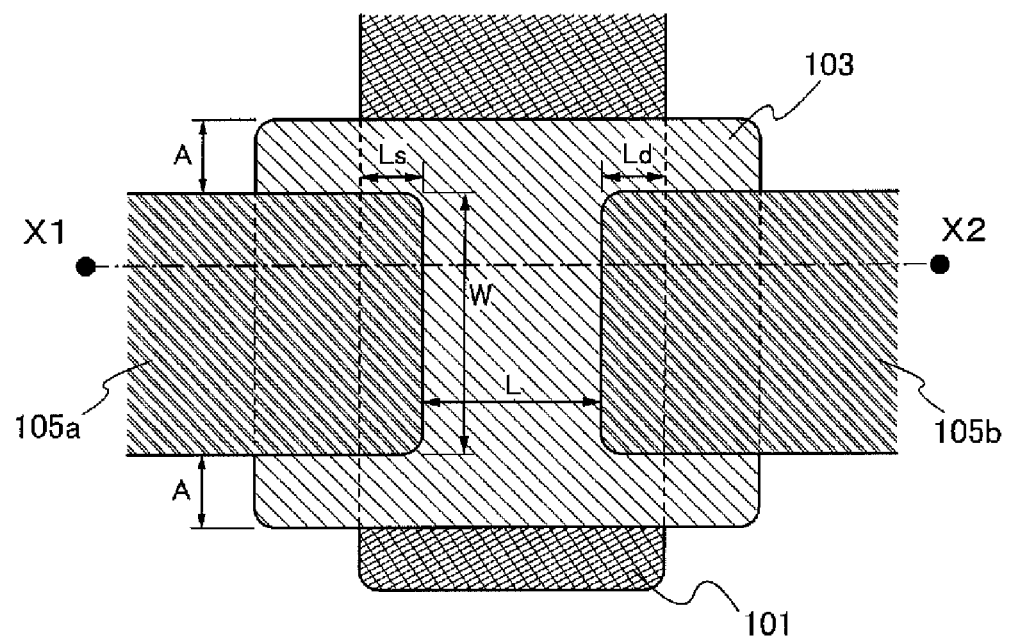
FIG. 4 is a top view illustrating an embodiment of the present invention.

FIG. 4 is a top view of the thin film transistor 150 described in this embodiment. FIG. 3D illustrates a cross-sectional structure taken along line X1-X2 in FIG. 4. In FIG. 4, L represents the channel length and W represents the channel width. In addition, A represents the length of a region where the oxide semiconductor layer 103 does not overlap with the source electrode layer 105a or the drain electrode layer 105b in a direction parallel with a channel width direction. Ls represents the length of part of the source electrode layer 105a which overlaps with the gate electrode layer 101, and Ld represents the length of part of the drain electrode layer 105b which overlaps with the gate electrode layer 101.

Note that the data showing channel length dependence in FIGS. 16 to 19 are based on the channel length L of FIG. 4. In addition, the thin film transistor 150 at a stage when the protective insulating layer 107 is formed is used in the samples of FIGS. 16 to 19.

After a silicon oxide film having a thickness of 300 nm is formed as the protective insulating layer 107, second heat treatment is performed at a temperature in the range of 100° C. to 300° C. in a state where the substrate is disposed in a hollow portion of a structure body of a conductive material so as not to be exposed to a wind. In this embodiment, the substrate is stored in a space enclosed by an aluminum tray and an aluminum cover, and the substrate is heated at 150° C. for two hours while the aluminum tray and cover are electrically connected to a ground potential. By this second heat treatment, a thin film transistor including an oxide semiconductor layer can be formed in which the threshold voltage at which a channel is formed is as close to 0 V as possible.

In addition, the timing of the second heat treatment is not limited to being shortly after the formation of the protective insulating layer 107 and may be after a wiring or an electrode (such as a pixel electrode) is formed thereover.

Figure 5A:
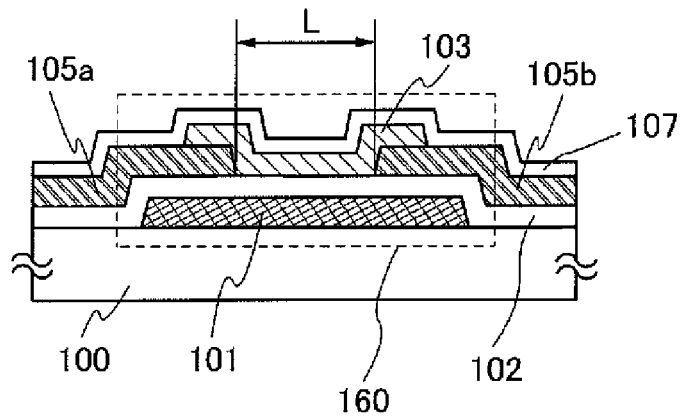
FIGS. 5A to 5C are cross-sectional views illustrating an embodiment of the present invention.
Figure 5B:
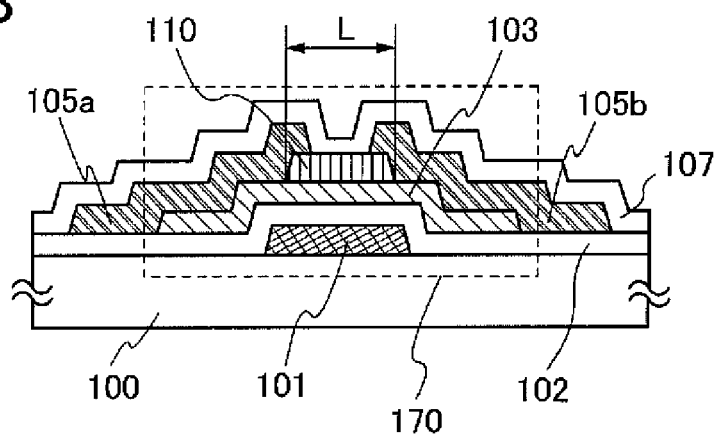
Figure 5C:
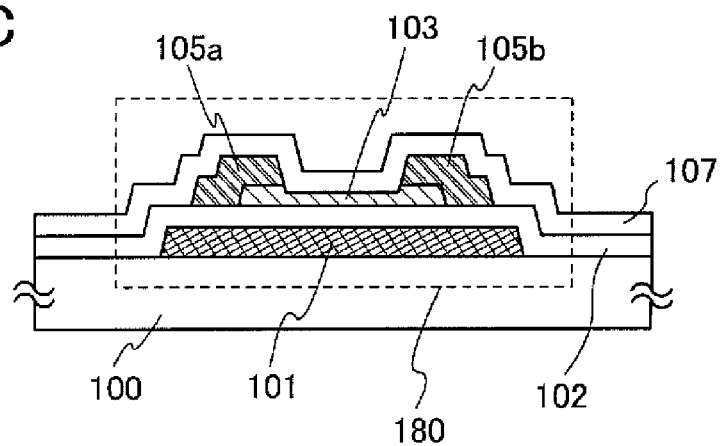

Although a method for manufacturing the bottom-gate thin film transistor 150 illustrated in FIG. 3D is described in this embodiment, the structure of this embodiment is not limited thereto. A thin film transistor 160 of a bottom-contact type (inverted-coplanar type) having a bottom-gate structure as illustrated in FIG. 5A, a thin film transistor 170 of a channel-protective type (also referred to as a channel-stop type) including a channel protective layer 110 as illustrated in FIG. 5B, or the like can also be formed using similar materials and similar methods. FIG. 5C illustrates another example of the channel-etched type thin film transistor. A thin film transistor 180 illustrated in FIG. 5C has a structure in which the gate electrode layer 101 extends to an outer side beyond an edge portion of the oxide semiconductor layer 103.

Note that the channel length (L in FIG. 4) of the thin film transistor is defined as a distance between the source electrode layer 105a and the drain electrode layer 105b, and the channel length of the channel-protective thin film transistor is defined as the width of the channel protective layer in a direction parallel with a carrier flow direction.

Embodiment 2

In Embodiment 1, an example in which a tray with a cover is used as a storage container for a substrate is described; in this embodiment, a container having a quadrangular prism shape is used.

Figure 6A:
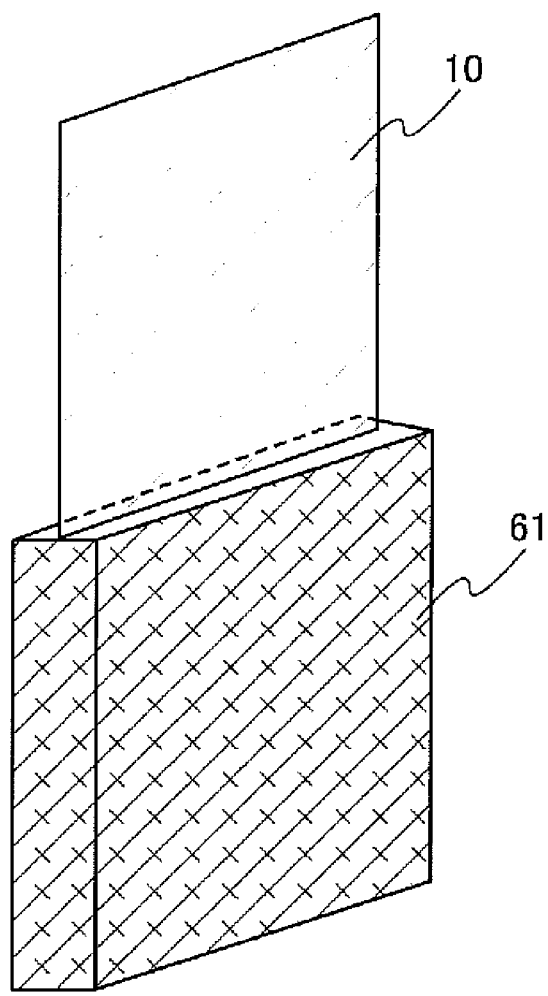
FIGS. 6A and 6B are an external view and a top view illustrating an embodiment of the present invention.
Figure 6B:
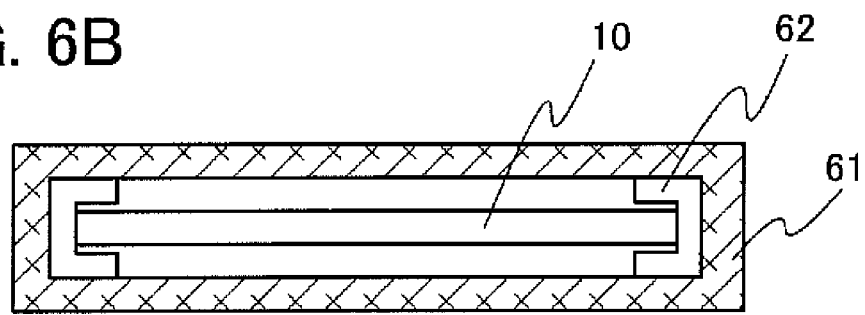

FIG. 6A is a schematic diagram illustrating a state shortly before a substrate 10 is put in a container 61 having a quadrangular prism shape. In this embodiment, the container 61 is illustrated as storing a substrate in a state where one substrate surface is directed vertical. Note that FIG. 6B is a top view of the container 61 in a state after the substrate 10 is stored therein, and a substrate holding member 62 is provided in contact with the substrate. For the container 61, a conductive material such as aluminum, copper, titanium, molybdenum, tungsten, or niobium is used. The substrate holding member 62 is also preferably formed using a conductive material.

Note that FIGS. 6A and 6B illustrate the container 61 which is configured to store only one substrate, whereas the container may be configured to store a plurality of substrates. For example, in the case of a container capable of storing ten substrates, productivity can be improved. Furthermore, the present invention is not limited to the container configured to store a substrate in a state where one substrate surface is vertical to a floor. A container configured to store a substrate in a state where a substrate surface is parallel with a floor may be used. For example, a substrate may be heated while being placed in a cylindrical container so as not to be exposed to a wind.

In addition, the container 61 in which the substrate 10 is stored is placed on the shelf of the heating apparatus in FIG. 2 and subjected to the second heat treatment while being electrically connected to a ground potential.

With the use of the container 61 illustrated in FIG. 6A, the exposure of the substrate 10 to hot air can be reduced at the time of heat treatment in a hot air circulation type heating apparatus. Accordingly, the generation of static electricity can be suppressed, and a change in threshold voltage of the thin film transistor provided over the substrate 10 can be controlled.

This embodiment can be freely combined with Embodiment 1.

Embodiment 3

In Embodiments 1 and 2, examples of using containers are described; in this embodiment, metal foil is wrapped around a substrate, which is placed on the shelf of the heating apparatus in FIG. 2 and heated while being electrically connected to a ground potential.

Figure 7A:
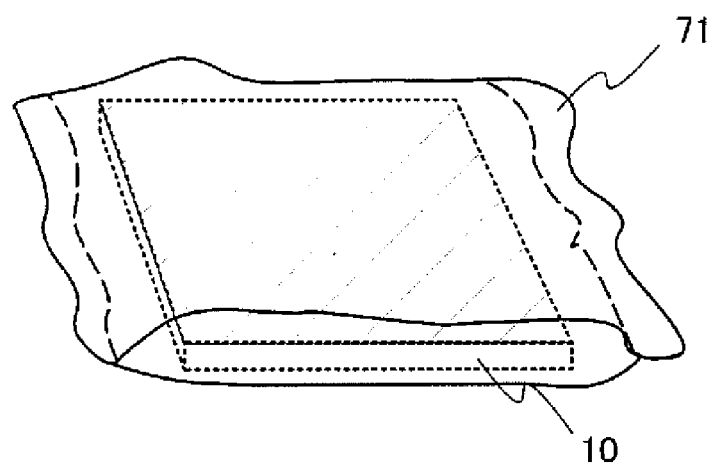
FIGS. 7A and 7B are external views illustrating an embodiment of the present invention.
Figure 7B:

FIG. 7A is an external view in which one substrate 10 is wrapped in metal foil 71. FIG. 7B is a cross-sectional view thereof.

As a material of the metal foil 71, aluminum, copper, titanium, molybdenum, tungsten, niobium, or the like is used. In this embodiment, aluminum foil is used.

A sheet of aluminum foil may be used to wrap the substrate 10, or a plurality of sheets, two or more sheets, of aluminum foil may be used to wrap the substrate 10. In addition, it is preferable that a substrate is put in a hollow space surrounded by aluminum foil, which is hermetically sealed with kapton tape or the like so as not to expose the substrate to ambient air.

A substrate wrapped in aluminum foil is placed on the shelf of the heating apparatus in FIG. 2 and subjected to the second heat treatment at 100° C. to 300° C. while the aluminum foil is electrically connected to a ground potential.

By wrapping the metal foil 71 around the substrate 10 as illustrated in FIG. 7A, the exposure of the substrate 10 to hot air can be reduced at the time of heat treatment in a hot air circulation type heating apparatus. Accordingly, the generation of static electricity can be suppressed, and a change in threshold voltage of the thin film transistor provided over the substrate 10 can be controlled.

For example, the second heat treatment can be performed while a substrate wrapped in aluminum foil is placed in the tray with the tray cover illustrated in FIGS. 1A and 1B for double hermetical sealing. Alternatively, the second heat treatment can be performed while a substrate wrapped in aluminum foil is placed in the container 61 illustrated in FIGS. 6A and 6B.

Further alternatively, metal foil may be used instead of the tray cover illustrated in FIGS. 1A and 1B, and the second heat treatment may be performed while a substrate is stored in a hollow space formed by the tray body and the metal foil.

Moreover, metal foil may be used to close an opening of the container 61 illustrated in FIGS. 6A and 6B, and then the second heat treatment may be performed.

This embodiment can be freely combined with Embodiment 1 or Embodiment 2.

Embodiment 4

In this embodiment, the case where thin film transistors are manufactured and a semiconductor device (also referred to as a display device) having a display function in which the thin film transistors are used for a pixel portion and a driver circuit is manufactured will be described. Further, part or whole of the driver circuit can be formed over the same substrate as the pixel portion with the use of a thin film transistor, whereby a system-on-panel can be obtained.

The display device includes a display element. As the display element, a liquid crystal element (also referred to as a liquid crystal display element) or a light emitting element (also referred to as a light emitting display element) can be used. The light emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The display device relates to an embodiment of an element substrate before the display element is completed in a manufacturing process of the display device, and the element substrate is provided with a means for supplying a current to the display element in each of a plurality of pixels. Specifically, the element substrate may be in a state in which only a pixel electrode of the display element is provided, a state after formation of a conductive layer to be a pixel electrode and before etching of the conductive film to form the pixel electrode, or any other states.

Note that a display device in this specification means an image display device, a display device, or a light source (including a lighting device). Further, the display device includes the following modules in its category: a module including a connector such as a flexible printed circuit (FPC), a tape automated bonding (TAB) tape, or a tape carrier package (TCP); a module having a TAB tape or a TCP which is provided with a printed wiring board at the end thereof; and a module having an integrated circuit (IC) which is directly mounted on a display element by a chip on glass (COG) method.

Figure 8B:
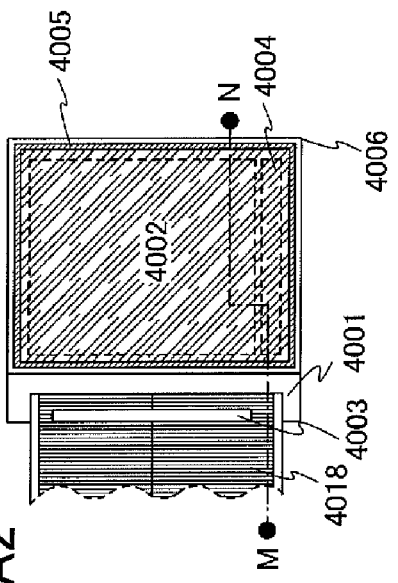
Figure 8B:
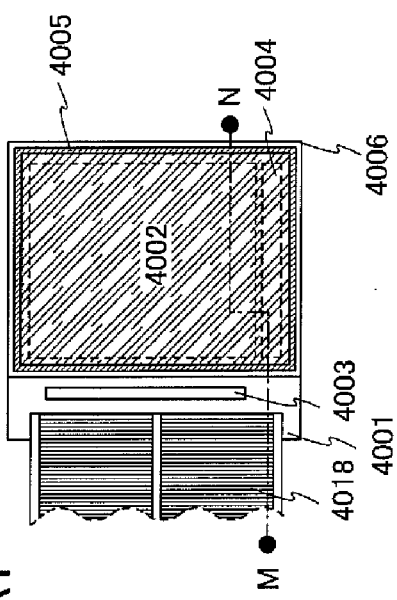
Figure 8B:
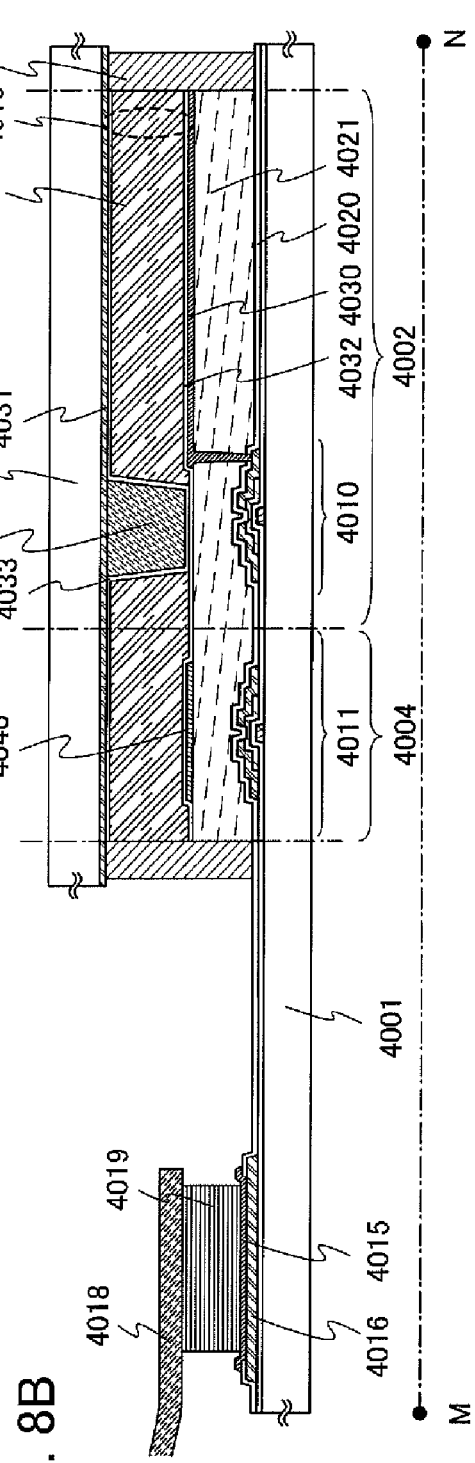

In this embodiment, an example of a liquid crystal display device is described as a semiconductor device which is an embodiment of the present invention. First, the appearance and the cross section of a liquid crystal display panel, which is an embodiment of a semiconductor device, are described with reference to FIGS. 8A1, 8A2, and 8B. FIGS. 8A1 and 8A2 are each a top view of a panel in which thin film transistors 4010 and 4011 each including a semiconductor layer of an In—Ga—Zn—O-based non-single-crystal layer, and a liquid crystal element 4013, which are formed over a first substrate 4001, are sealed between the first substrate 4001 and a second substrate 4006 with a sealant 4505. FIG. 8B corresponds to a cross-sectional view of FIGS. 8A1 and 8A2 along line M-N.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor or a polycrystalline semiconductor over a substrate separately prepared is mounted in a region that is different from the region surrounded by the sealant 4005 over the first substrate 4001.

Note that a connection method of a driver circuit which is separately formed is not particularly limited, and a COG method, a wire bonding method, a TAB method, or the like can be used. FIG. 8A1 illustrates an example of mounting the signal line driver circuit 4003 by a COG method, and FIG. 8A2 illustrates an example of mounting the signal line driver circuit 4003 by a TAB method.

Further, the pixel portion 4002 and the scan line driver circuit 4004 provided over the first substrate 4001 each include a plurality of thin film transistors. FIG. 8B illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

The thin film transistor including the oxide semiconductor layer which is described in Embodiment 1 can be used as each of the thin film transistors 4010 and 4011. In this embodiment, the thin film transistors 4010 and 4011 are n-channel thin film transistors.

A conductive layer 4040 is provided over part of the insulating layer 4021, which overlaps with a channel formation region of the oxide semiconductor layer in the thin film transistor 4011 for the drive circuit. The conductive layer 4040 is provided at the position overlapping with the channel formation region of the oxide semiconductor layer, whereby the amount of change in threshold voltage of the thin film transistor 4011 before and after the BT test can be reduced. A potential of the conductive layer 4040 may be the same as or different from that of a gate electrode layer of the thin film transistor 4011. The conductive layer 4040 can also function as a second gate electrode layer. In addition, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is provided on the second substrate 4006. A portion where the pixel electrode layer 4030, the counter electrode layer 4031, and the liquid crystal layer 4008 overlap with each other corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be formed of glass, metal (typically, stainless steel), ceramic, or plastic. As plastic, a fiberglass-reinforced plastic (FRP) plate, a polyvinyl fluoride (PVF) film, a polyester film, or an acrylic resin film can be used. In addition, a sheet with a structure in which an aluminum foil is sandwiched between PVF films or polyester films can be used.

A spacer 4035 is a columnar spacer obtained by selective etching of an insulating layer and is provided in order to control the distance (a cell gap) between the pixel electrode layer 4030 and the counter electrode layer 4031. Alternatively, a spherical spacer may be used. In addition, the counter electrode layer 4031 is electrically connected to a common potential line formed over the same substrate as the thin film transistor 4010. Furthermore, with the use of a common connection portion, the counter electrode layer 4031 and the common potential line can be electrically connected to each other by conductive particles arranged between a pair of substrates. Note that the conductive particles are included in the sealant 4005.

In addition, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at greater than or equal to 5 wt % is used for the liquid crystal layer 4008 in order to widen the temperature range. The liquid crystal composition which includes a liquid crystal exhibiting a blue phase and a chiral agent has a short response time of less than or equal to 1 msec, has optical isotropy, which makes the alignment process unneeded, and has a small viewing angle dependence.

When a liquid crystal exhibiting a blue phase is used, rubbing treatment on an alignment film is unnecessary; accordingly, electrostatic discharge damage caused by the rubbing treatment can be prevented and defects and damage of the liquid crystal display device in the manufacturing process can be reduced. Thus, productivity of the liquid crystal display device can be improved. A thin film transistor which uses an oxide semiconductor layer particularly has a possibility that electrical characteristics of the thin film transistor may significantly change and deviate from the designed range by the influence of static electricity. Therefore, it is more effective to use a blue phase liquid crystal material for a liquid crystal display device including a thin film transistor that uses an oxide semiconductor layer.

Note that the liquid crystal display device described in this embodiment is an example of a transmissive liquid crystal display device; however, the liquid crystal display device can be applied to either a reflective liquid crystal display device or a semi-transmissive liquid crystal display device.

An example of the liquid crystal display device described in this embodiment is illustrated in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The layered structure of the polarizing plate and the coloring layer is not limited to that in this embodiment and may be set as appropriate depending on materials of the polarizing plate and the coloring layer or conditions of the manufacturing process. Further, a light blocking layer serving as a black matrix may be provided as needed.

In addition, in this embodiment, in order to reduce the surface roughness of the thin film transistor and to improve the reliability of the thin film transistor, the thin film transistor is covered with the insulating layers (the insulating layer 4020 and the insulating layer 4021) each serving as a protective layer or a planarization insulating layer. Note that the protective layer is provided to prevent entry of contaminant impurities such as organic substance, metal, or water vapor contained in the air and is preferably a dense film. The protective layer may be formed with a single layer or stacked layers using one or more of a silicon oxide layer, a silicon nitride layer, a silicon oxynitride layer, a silicon nitride oxide layer, an aluminum oxide layer, an aluminum nitride layer, an aluminum oxynitride layer, and an aluminum nitride oxide layer by a sputtering method. Although an example in which the protective layer is formed by a sputtering method is described in this embodiment, the present invention is not limited to this method and a variety of methods may be employed.

In this embodiment, the insulating layer 4020 having a layered structure is formed as a protective layer. Here, a silicon oxide layer is formed by a sputtering method, as a first layer of the insulating layer 4020. The use of a silicon oxide layer as a protective layer is effective in preventing hillock of an aluminum layer which is used as source and drain electrode layers.

As a second layer of the protective layer, an insulating layer is formed. Here, a silicon nitride layer is formed by a sputtering method, as a second layer of the insulating layer 4020. The use of the silicon nitride layer as the protective layer can prevent ions of sodium or the like from entering a semiconductor region so that a change in electrical characteristics of the TFT can be suppressed.

The insulating layer 4021 is formed as the planarization insulating layer. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating layers formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the insulating layer 4021. The insulating layer 4021 can be formed, depending on the material, by a method such as a sputtering method, an SOG method, a spin coating method, a dipping method, a spray coating method, or a droplet discharge method (e.g., an ink-jet method, screen printing, or offset printing), or a tool (equipment) such as a doctor knife, a roll coater, a curtain coater, or a knife coater. In the case of forming the insulating layer 4021 using a material solution, annealing (300° C. to 400° C.) of the semiconductor layer may be performed at the same time as a baking step. The baking step of the insulating layer 4021 also serves as annealing of the semiconductor layer, whereby a semiconductor device can be manufactured efficiently.

The pixel electrode layer 4030 and the counter electrode layer 4031 can be formed using a light transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

A conductive composition containing a conductive high molecule (also referred to as a conductive polymer) can be used for the pixel electrode layer 4030 and the counter electrode layer 4031. The pixel electrode formed using the conductive composition preferably has a sheet resistance of 10000 ohms per square or less and a transmittance of 70% or more at a wavelength of 550 nm. Further, the resistivity of the conductive high molecule contained in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

After the pixel electrode layer 4030 is formed, the second heat treatment (at 100° C. to 300° C.) is performed while the first substrate 4001 provided with the pixel electrode layer 4030 and the thin film transistors 4010 and 4011 is put in a tray, which is hermetically sealed so as not to expose the substrate to a wind as described in Embodiment 1. By performing the second heat treatment, threshold voltage can be controlled and a plurality of thin film transistors provided over the first substrate 4001 can serve as normally off thin film transistors.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed from the same conductive layer as the pixel electrode layer 4030 included in the liquid crystal element 4013, and a terminal electrode 4016 is formed from the same conductive layer as the source and drain electrode layers of the thin film transistors 4010 and 4011.

The connection terminal electrode 4015 is electrically connected to a terminal included in the FPC 4018 via an anisotropic conductive layer 4019.

FIGS. 8A1, 8A2, and 8B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

In addition, if necessary, a color filter is provided for each pixel. Furthermore, a polarizing plate or a diffusion plate is provided on the outer side of the first substrate 4001 and the second substrate 4006. Moreover, a liquid crystal display module is obtained using a cold cathode tube or an LED as a light source of a backlight.

The liquid crystal display module can employ a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like.

Through this process, a liquid crystal display device with high yield can be manufactured.

By manufacturing a thin film transistor in the driver circuit of the liquid crystal display device using the method for manufacturing a thin film transistor described in Embodiment 1, a normally off thin film transistor can be provided in the driver circuit portion, so that power consumption can be reduced.

This embodiment can be implemented in appropriate combination with the structures described in other embodiments.

Embodiment 5

An example of an electronic paper will be described as an embodiment of a semiconductor device.

The thin film transistor described in Embodiment 1 can be used for an electronic paper in which electronic ink is driven by an element electrically connected to a switching element. The electronic paper is also called an electrophoretic display device (electrophoretic display) and has advantages in that it has the same level of readability as regular paper, less power consumption than other display devices, and can be set to have a thin and light form.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high electric field region.

A solution in which the above microcapsules are dispersed in a solvent is referred to as electronic ink. This electronic ink can be applied to a surface of glass, plastic, cloth, paper, or the like by printing. Furthermore, by using a color filter or particles that have a pigment, color display can be achieved.

In addition, if a plurality of the above microcapsules is arranged as appropriate over an active matrix substrate so as to be interposed between two electrodes, an active matrix display device can be completed, and display can be performed by application of an electric field to the microcapsules. For example, the active matrix substrate obtained by using the thin film transistor described in Embodiment 1 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these materials.

Figure 9:
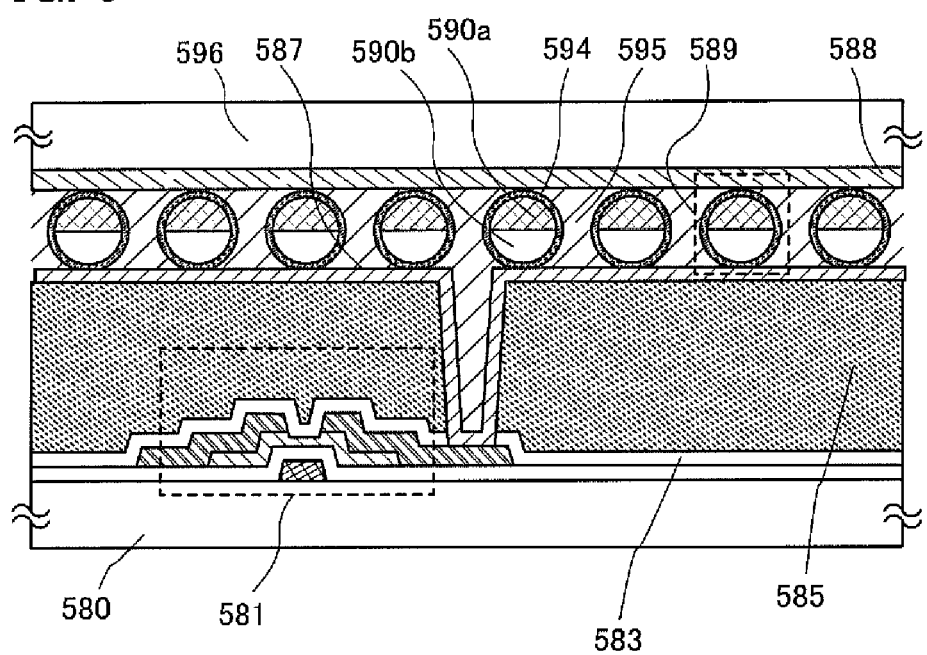
FIG. 9 is a cross-sectional view illustrating an embodiment of the present invention.

FIG. 9 illustrates an active matrix electronic paper as an example of a semiconductor device. A thin film transistor 581 used for the semiconductor device can be formed in a manner similar to that of the thin film transistor described in Embodiment 1, which is a thin film transistor including an oxide semiconductor layer and having high yield.

The electronic paper in FIG. 9 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between a substrate 580 and a substrate 596 is a bottom gate thin film transistor and is covered with an insulating layer 583 which is in contact with a semiconductor layer. A source or drain electrode layer of the thin film transistor 581 is in contact with and electrically connected to a first electrode layer 587 through an opening formed in the insulating layers 583 and 585. Spherical particles 589 are provided between the first electrode layer 587 and a second electrode layer 588. Each of the spherical particles 589 includes a black region 590a, a white region 590b, and a cavity 594 filled with liquid around the black region 590a and the white region 590b. The circumference of the spherical particles 589 is filled with a filler 595 such as a resin (see FIG. 9). The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Further, instead of the twisting ball, an electrophoretic element can be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move in opposite directions, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a liquid crystal display device with high yield can be manufactured.

This embodiment can be implemented in appropriate combination with the structures described in other embodiments.

Embodiment 6

Figure 10A:
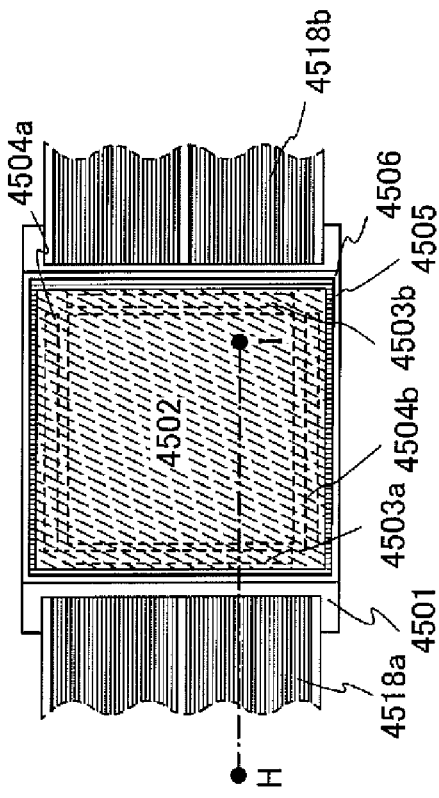
FIGS. 10A and 10B are a top view and a cross-sectional view illustrating an embodiment of the present invention.
Figure 10B:
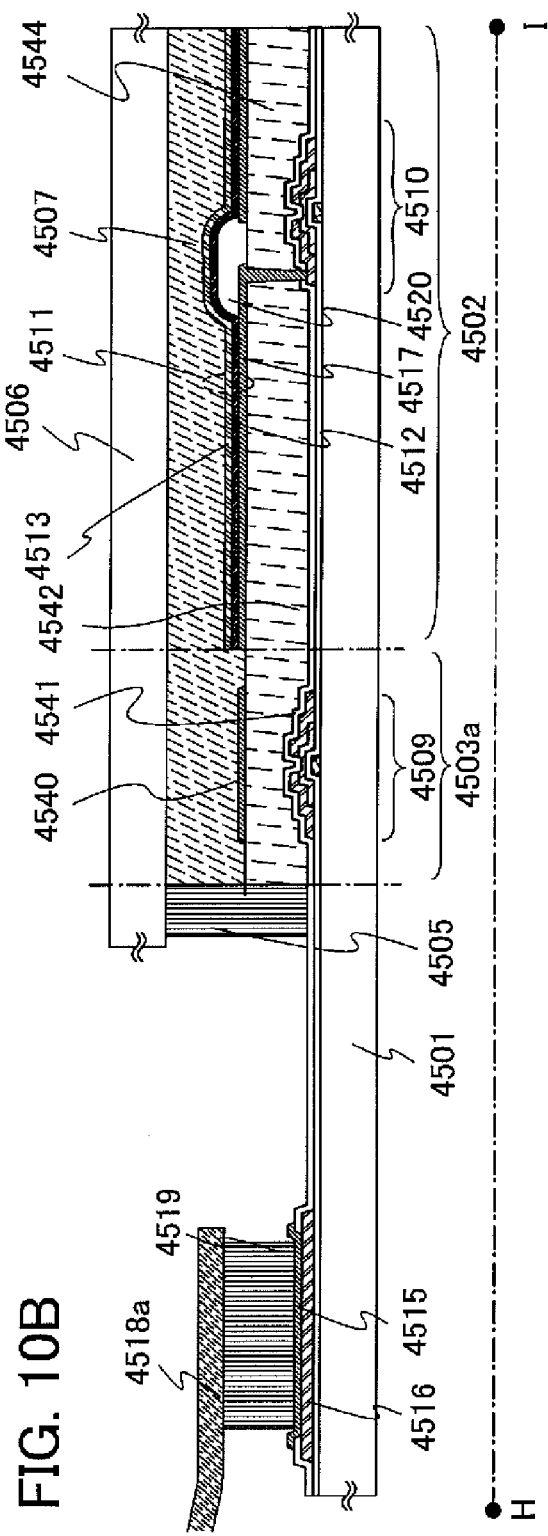

The appearance and the cross section of a light emitting display panel (also referred to as a light emitting panel) which corresponds to an embodiment of a semiconductor device is described with reference to FIGS. 10A and 10B. FIG. 10A is a top view of a panel in which a thin film transistor and a light emitting element formed over a first substrate are sealed between the first substrate and a second substrate with a sealant. FIG. 10B is a cross-sectional view taken along line H-I of FIG. 10A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 10B.

For the thin film transistors 4509 and 4510, the thin film transistor including an oxide semiconductor layer and having high yield as described in Embodiment 1 can be employed. In this embodiment, the thin film transistors 4509 and 4510 are n-channel thin film transistors.

A conductive layer 4540 is provided over part of an insulating layer 4544, which overlaps with a channel formation region of an oxide semiconductor layer in the thin film transistor 4509 for the driver circuit. The conductive layer 4540 is provided at the position overlapping with the channel formation region of the oxide semiconductor layer, whereby the amount of change in threshold voltage of the thin film transistor 4509 before and after the BT test can be reduced. A potential of the conductive layer 4540 may be the same as or different from that of a gate electrode layer of the thin film transistor 4509. The conductive layer 4540 can also function as a second gate electrode layer. In addition, the potential of the conductive layer 4540 may be GND or 0 V, or the conductive layer 4540 may be in a floating state.

In the thin film transistor 4509, an insulating layer 4541 is formed in contact with the semiconductor layer including the channel formation region, as a protective insulating layer. The insulating layer 4541 can be formed using a material and a method which are similar to those of the protective insulating layer 107 described in Embodiment 1. Moreover, the insulating layer 4544 functioning as a planarization insulating layer covers the thin film transistors in order to reduce surface unevenness caused by the thin film transistors. Here, as the insulating layer 4541, a silicon oxide layer is formed by a sputtering method using the protective insulating layer 107 in Embodiment 1.

A protective insulating layer 4542 is formed over the insulating layer 4541. The protective insulating layer 4542 may be formed using a material and a method which are similar to those of the protective insulating layer 107 described in Embodiment 1. Here, a silicon nitride layer is formed by a PCVD method as the protective insulating layer 4542.

The insulating layer 4544 is formed as the planarization insulating layer. The insulating layer 4544 may be formed using a material and a method which are similar to those of the insulating layer 4021 described in Embodiment 4. Here, acrylic is used for the insulating layer 4544.

Moreover, reference numeral 4511 denotes a light emitting element. A first electrode layer 4517 which is a pixel electrode included in the light emitting element 4511 is electrically connected to a source electrode layer or a drain electrode layer of the thin film transistor 4510. Note that the structure of the light emitting element 4511 is, but not limited to, the layered structure which includes the first electrode layer 4517, an electroluminescent layer 4512, and a second electrode layer 4513. The structure of the light emitting element 4511 can be changed as appropriate depending on the direction in which light is extracted from the light emitting element 4511, or the like.

A partition 4520 is formed using an organic resin layer, an inorganic insulating layer, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective layer may be formed over the second electrode layer 4513 and the partition 4520 in order to prevent entry of oxygen, hydrogen, moisture, carbon dioxide, or the like into the light emitting element 4511. As the protective layer, a silicon nitride layer, a silicon nitride oxide layer, a DLC layer, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive layer as the first electrode layer 4517 included in the light emitting element 4511, and a terminal electrode 4516 is formed from the same conductive layer as the source and drain electrode layers included in the thin film transistors 4509 and 4510.

The connection terminal electrode 4515 is electrically connected to a terminal included in the FPC 4518a via an anisotropic conductive layer 4519.

The second substrate located in the direction in which light is extracted from the light emitting element 4511 needs to have a light transmitting property. In that case, a light transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light emitting surface of the light emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be mounted as driver circuits formed using a single crystal semiconductor or a polycrystalline semiconductor over a substrate separately prepared. Alternatively, only the signal line driver circuits or part thereof, or the scan line driver circuits or part thereof may be separately formed and mounted. This embodiment is not limited to the structure illustrated in FIGS. 10A and 10B.

Through the above process, a light emitting display device (display panel) with high yield can be manufactured.

A full color display device can be realized using a red light emitting element, a blue light emitting element, and a green light emitting element in a pixel portion. When a white light emitting element is used as a light emitting element in a light emitting display device, the light emitting display device can also be used for lighting.

By manufacturing a thin film transistor in a pixel portion of a light emitting display device using the heating method described in Embodiment 1, the threshold voltage of the thin film transistor in each pixel can be controlled.

This embodiment can be implemented in appropriate combination with the structures described in other embodiments.

Embodiment 7

Semiconductor devices disclosed in this specification can be applied to a variety of electronic devices (including amusement machines). Examples of electronic devices include television devices (also referred to as televisions or television receivers), monitors for computers and the like, cameras such as digital cameras and digital video cameras, digital photo frames, mobile phone devices (also referred to as mobile phones or cellular phones), portable game machines, portable information terminals, sound reproducing devices, large game machines such as pachinko machines, and solar batteries.

Figure 11A:
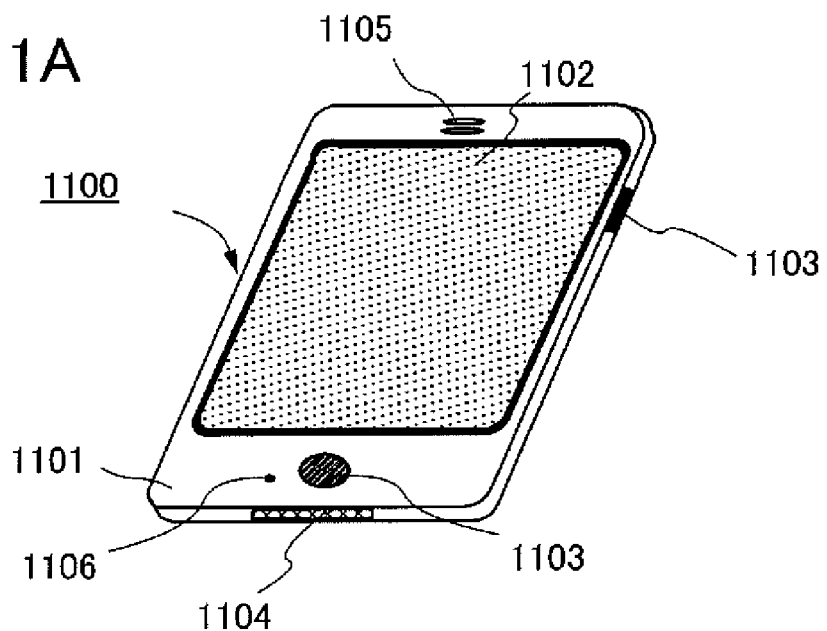
FIGS. 11A and 11B are diagrams illustrating examples of electronic devices.

FIG. 11A illustrates an example of a mobile phone 1100. The mobile phone 1100 is provided with a display portion 1102 incorporated in a housing 1101, an operation button 1103, an external connection port 1104, a speaker 1105, a microphone 1106, and the like.

When the display portion 1102 of the mobile phone 1100 illustrated in FIG. 11A is touched with a finger or the like, data can be input into the mobile phone 1100. Further, operation such as making calls and texting can be performed by touching the display portion 1102 with a finger or the like.

There are mainly three screen modes of the display portion 1102. The first mode is a display mode mainly for displaying an image. The second mode is an input mode mainly for inputting data such as text. The third mode is a display-and-input mode, which is a combination of the two modes, that is, a combination of the display mode and the input mode.

For example, in the case of making a call or texting, the text input mode mainly for inputting text is selected for the display portion 1102 so that characters displayed on a screen can be input. In that case, it is preferable to display a keyboard or number buttons on almost all area of the screen of the display portion 1102.

When a detection device including a sensor for detecting inclination, such as a gyroscope or an acceleration sensor, is provided inside the mobile phone 1100, display on the screen of the display portion 1102 can be automatically changed by determining the orientation of the mobile phone 1100 (whether the mobile phone 1100 stands upright or is laid down on its side).

The screen modes are changed by touching the display portion 1102 or using the operation button 1103 of the housing 1101. Alternatively, the screen modes may be changed depending on the kind of the image displayed on the display portion 1102. For example, when a signal for an image to be displayed on the display portion is data of moving images, the screen mode is changed to the display mode. When the signal is text data, the screen mode is changed to the input mode.

Further, in the input mode, when input by touching the display portion 1102 is not performed for a certain period while a signal detected by an optical sensor in the display portion 1102 is detected, the screen mode may be controlled so as to be changed from the input mode to the display mode.

The display portion 1102 can also function as an image sensor. For example, when the display portion 1102 is touched with a palm or a finger, an image of a palm print, a fingerprint, or the like is taken, whereby personal identification can be performed. Further, when a backlight or a sensing light source which emits near-infrared light is provided in the display portion, an image of a finger vein, a palm vein, or the like can be taken.

In the display portion 1102, a plurality of thin film transistors described in Embodiment 1 is provided as switching elements of pixels.

Figure 11B:
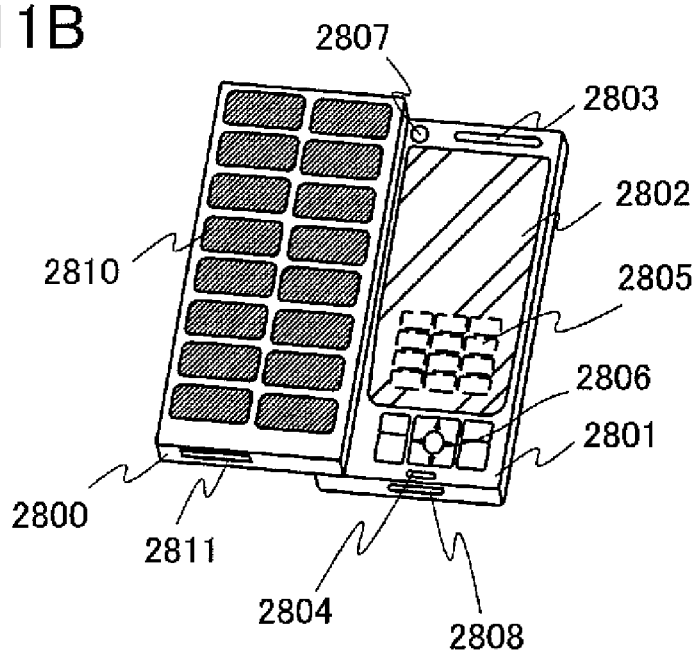

FIG. 11B illustrates another example of a mobile phone. A portable information terminal, one example of which is illustrated in FIG. 11B, can have a plurality of functions. For example, in addition to a telephone function, such a portable information terminal can have various data processing functions by incorporating a computer.

The portable information terminal illustrated in FIG. 11B has a housing 2800 and a housing 2801. The housing 2801 is provided with a display panel 2802, a speaker 2803, a microphone 2804, a pointing device 2806, a camera lens 2807, an external connection terminal 2808, and the like. The housing 2800 is provided with solar cells 2810 for charging the portable information terminal, an external memory slot 2811, and the like. In addition, an antenna is incorporated in the housing 2801.

The display panel 2802 is provided with a touch panel. A plurality of operation keys 2805 which are displayed as images is illustrated by dashed lines in FIG. 11B.

Further, in addition to the above structure, a contactless IC chip, a small-sized memory device, or the like may be incorporated.

A light emitting device can be used for the display panel 2802 and changes the direction of display as appropriate depending on an application mode. Because the camera lens 2807 is provided in the same plane as the display panel 2802, the portable information terminal can be used as a videophone. The speaker 2803 and the microphone 2804 can be used for operations such as video calls, sound recording, and playback without being limited to the voice call function. Moreover, the housings 2800 and 2801 in a state where they are developed as illustrated in FIG. 11B can be slid so that one is lapped over the other; therefore, the size of the portable information terminal can be reduced, which makes the portable information terminal suitable for being carried around.

The external connection terminal 2808 can be connected to an AC adaptor and a variety of cables such as a USB cable, and charging and data communication with a personal computer or the like are possible. Moreover, a recording medium can be inserted in the external memory slot 2811, and the portable information terminal can handle storage and transfer of a larger amount of data.

In addition to the above functions, an infrared communication function, a television reception function, or the like may be provided.

Figure 12A:
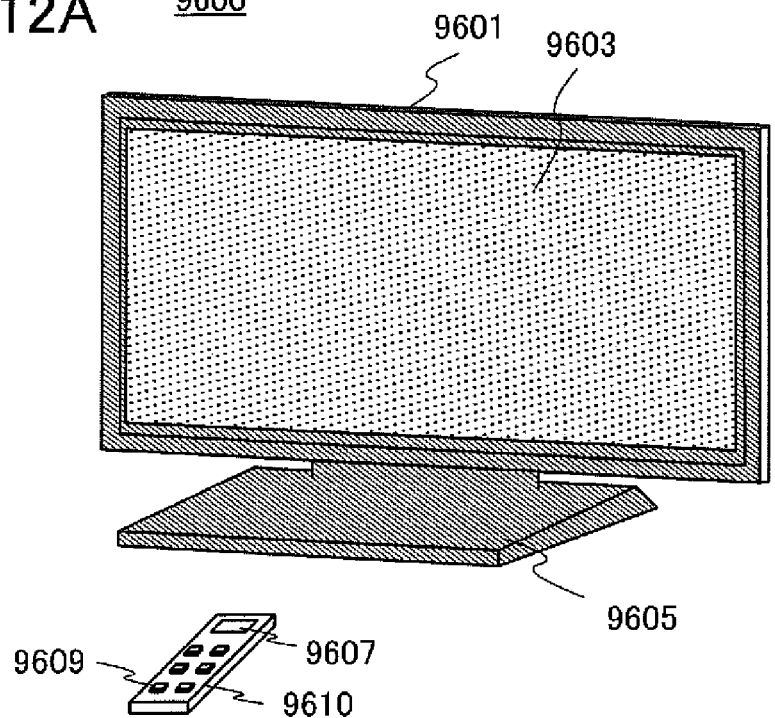
FIGS. 12A and 12B are diagrams illustrating examples of electronic devices.

FIG. 12A illustrates an example of a television device 9600. In the television device 9600, a display portion 9603 is incorporated in a housing 9601. The display portion 9603 can display an image. Further, the housing 9601 is supported by a stand 9605 here.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data output from the remote controller 9610.

Note that the television device 9600 is provided with a receiver, a modem, and the like. With the receiver, general television broadcast can be received. Further, when the television device 9600 is connected to a communication network by wired or wireless connection via the modem, one-way (from a transmitter to a receiver) or two-way (between a transmitter and a receiver or between receivers) data communication can be performed.

In the display portion 9603, a plurality of thin film transistors described in Embodiment 1 is provided as switching elements of pixels.

Figure 12B:
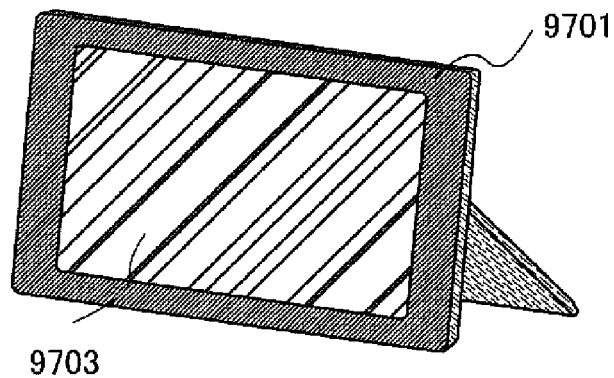

FIG. 12B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and can function like a normal photo frame.

In the display portion 9703, a plurality of thin film transistors described in Embodiment 1 is provided as switching elements of pixels.

Note that the digital photo frame 9700 is provided with an operation portion, an external connection terminal (e.g., a USB terminal, or a terminal which can be connected to various cables such as a USB cable), a recording medium insertion portion, and the like. Although these components may be provided on the surface where the display portion is provided, it is preferable to provide them on the side surface or the rear surface for the design of the digital photo frame 9700. For example, a memory which stores data of an image taken with a digital camera can be inserted in the recording medium insertion portion of the digital photo frame, and the image data can be transferred and then displayed on the display portion 9703.

Further, the digital photo frame 9700 may be configured to be able to transmit and receive data wirelessly. A structure may be employed in which desired image data are transferred wirelessly and displayed.

Figure 13:
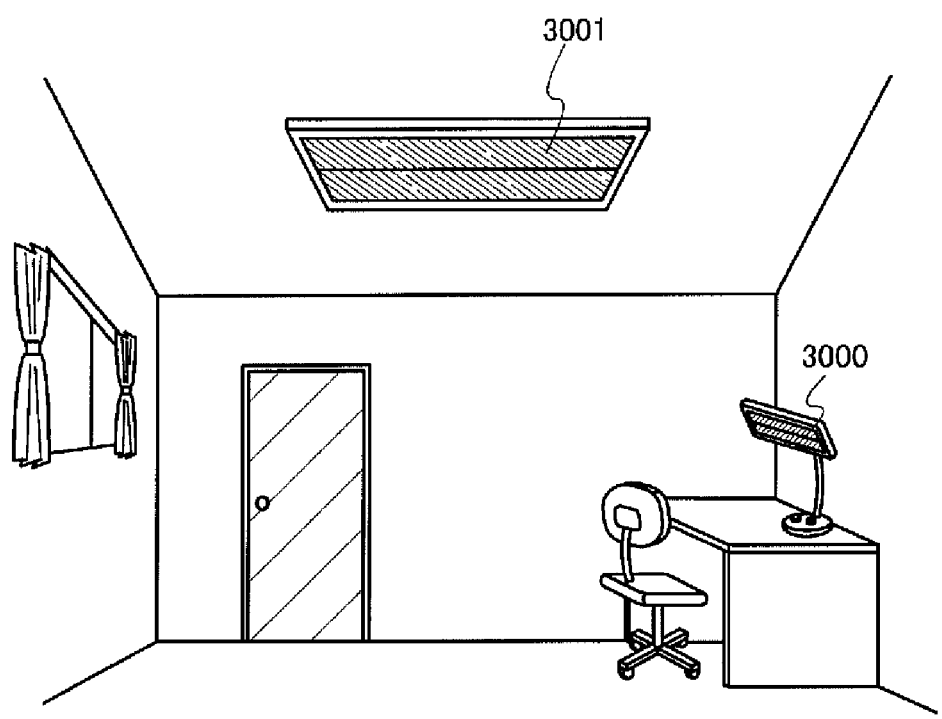
FIG. 13 is diagram illustrating examples of electronic devices.

FIG. 13 is an example in which the light emitting device formed in accordance with Embodiment 6 is used as an indoor lighting device 3001. Because the size of the light emitting device described in Embodiment 6 can be increased, the light emitting device can be used as a lighting device having a large area. Furthermore, the light emitting device described in Embodiment 6 can be used as a desk lamp 3000. Note that lighting equipment includes in its category, a wall light, a lighting device for an inside of a vehicle, a guide light and the like, as well as a ceiling light and a desk lamp.

In this manner, the thin film transistor described in Embodiment 1 can be provided in display panels of a variety of electronic devices as described above. With the use of the thin film transistor as a switching element of a display panel, low power consumption can be realized and an electronic device with high yield can be provided.

Embodiment 8

Semiconductor devices disclosed in this specification can be applied to electronic paper. Electronic paper can be used in electronic devices of various fields, which display information. For example, the electronic paper can be applied to e-book readers (electronic books), posters, advertisements on vehicles such as trains, displays on a variety of cards such as credit cards, or the like. An example of such electronic devices will be illustrated in FIG. 14.

Figure 14:
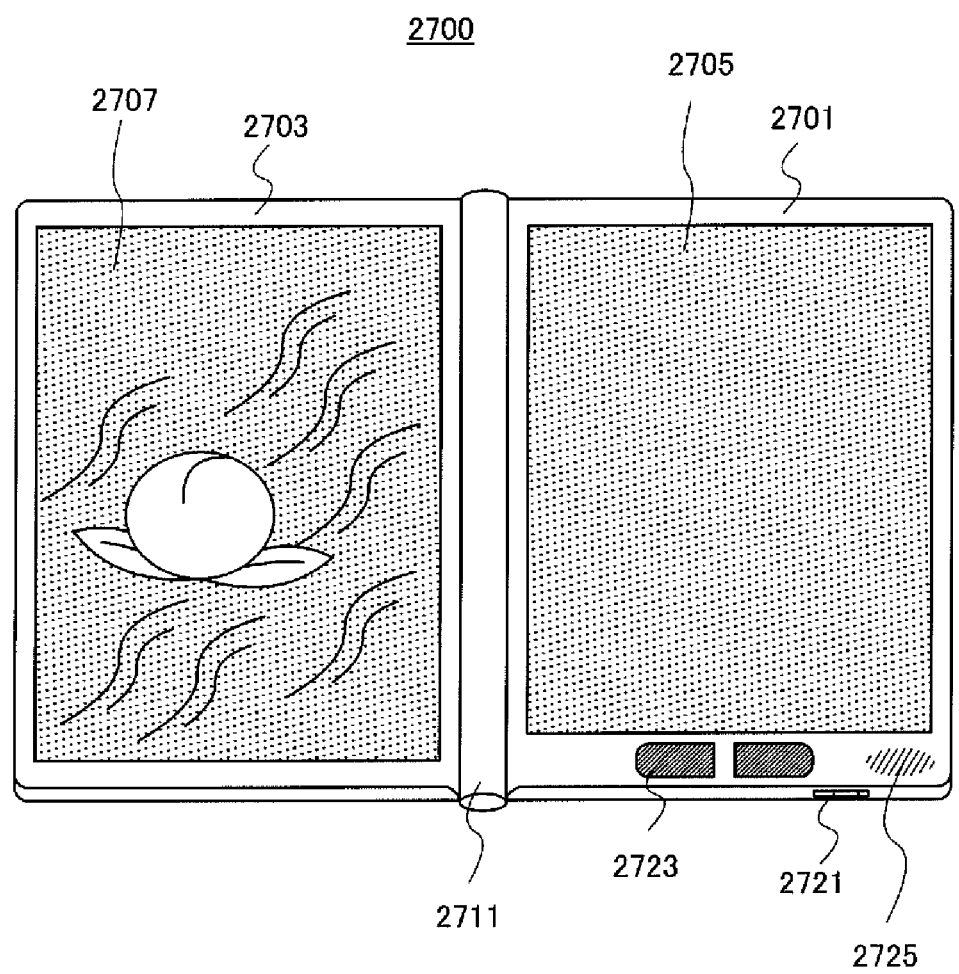
FIG. 14 is a diagram illustrating an example of an electronic device.

FIG. 14 illustrates an e-book reader 2700 as an example. For example, the e-book reader 2700 has two housings 2701 and 2703. The housings 2701 and 2703 are united with an axis portion 2711, and the e-book reader 2700 can be opened and closed with the axis portion 2711 as an axis. With such a structure, the e-book reader 2700 can be operated like a paper book.

A display portion 2705 is incorporated in the housing 2701. A display portion 2707 is incorporated in the housing 2703. The display portions 2705 and 2707 may display one image or different images. When the display portions display different images, text can be displayed on the right display portion (the display portion 2705 in FIG. 14) and an image can be displayed on the left display portion (the display portion 2707 in FIG. 14), for example.

Further, FIG. 14 illustrates an example where the housing 2701 is provided with an operation portion and the like. For example, the housing 2701 is provided with a power supply switch 2721, operation keys 2723, a speaker 2725, and the like. Pages can be turned by the operation key 2723. Note that a keyboard, a pointing device, or the like may be provided on the same side as the display portion in the housing. Moreover, an external connection terminal (e.g., an earphone terminal, a USB terminal, and a terminal which can be connected an AC adapter and a variety of cables such as a USB cable), a recoding medium insertion portion, or the like may be provided on a rear surface or a side surface of the housing. Furthermore, the e-book reader 2700 may function as an electronic dictionary.

In addition, the e-book reader 2700 may be configured to be able to transmit and receive information wirelessly. The e-book reader 2700 can also have a structure where desired book data or the like are wirelessly purchased and downloaded from an e-book server.

This embodiment can be implemented in combination with the thin film transistor described in Embodiment 1 or the structure of electronic paper described in Embodiment 5 as appropriate.

This application is based on Japanese Patent Application serial no. 2009-231612 filed with Japan Patent Office on Oct. 5, 2009, the entire contents of which are hereby incorporated by reference.

EXPLANATION OF REFERENCE

10: substrate, 11: tray body, 12: tray cover, 20: floor, 21: furnace body, 22: door, 23: outlet, 24: inlet, 25: heater, 26: fan, 27: shelf, 61: container, 62: substrate holding member, 71: metal foil, 100: substrate, 101: gate electrode layer, 102: gate insulating layer, 103: oxide semiconductor layer, 105a: source electrode layer, 105b: drain electrode layer, 107: protective insulating layer, 110: channel protective layer, 150: thin film transistor, 160: thin film transistor, 170: thin film transistor, 180: thin film transistor, 501: curve, 504: tangent line, 505: intercept of tangent line and gate voltage axis, 580: substrate, 581: thin film transistor, 583: insulating layer, 585: insulating layer, 587: electrode layer, 588: electrode layer, 589: spherical particle, 590a: black region, 590b: white region, 594: cavity, 595: filler, 596: substrate, 1100: mobile phone, 1101: housing, 1102: display portion, 1103: operation button, 1104: external connection port, 1105: speaker, 1106: microphone, 2700: e-book reader, 2701: housing, 2703: housing, 2705: display portion, 2707: display portion, 2711: axis portion, 2721: power supply switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal 2810: solar cell, 2811: external memory slot, 3000: desk lamp, 3001: lighting device, 4001: first substrate, 4002: pixel portion, 4003: signal line driver circuit, 4004: scan line driver circuit, 4005: sealant, 4006: second substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive layer, 4020: insulating layer, 4021: insulating layer, 4030: pixel electrode layer, 4031: counter electrode layer, 4032: insulating layer, 4040: conductive layer, 4501: first substrate, 4502: pixel portion, 4503a, 4503b: signal line driver circuit, 4504a, 4504b: scan line driver circuit, 4505: sealant, 4506: second substrate, 4507: filler, 4509: thin film transistor, 4510: thin film transistor, 4511: light emitting element, 4512: electroluminescent layer, 4513: electrode layer, 4515: connection terminal electrode, 4516: terminal electrode, 4517: electrode layer, 4518a, 4518b: FPC, 4519: anisotropic conductive layer, 4520: partition, 4540: conductive layer, 4541: insulating layer, 4542: protective insulating layer, 4544: insulating layer, 9600: television device, 9601: housing, 9603: display portion, 9605: stand, 9607: display portion, 9609: operation key, 9610: remote controller, 9700: digital photo frame, 9701: housing, and 9703: display portion.

The invention claimed is:

1. A method for removing electricity, comprising the steps of:
    placing a substrate provided with a thin film transistor in a tray body;
    placing a tray cover over the tray body so that the substrate provided with the thin film transistor is surrounded therein; and
    performing a heat treatment to suppress presence of a static charge at a surface of the substrate provided with the thin film transistor or suppress generation of a static charge which is caused by wind,
    wherein each of the tray body and the tray cover contains a conductive material,
    wherein a combination of the tray body and the tray cover constitutes a conductive storage container, and
    wherein at least one of the tray body and the tray cover has a depressed surface which has a larger area than the substrate.

2. The method for manufacturing a semiconductor device according to claim 1, wherein the thin film transistor comprises an oxide semiconductor layer.

3. A method for manufacturing a semiconductor device, comprising the steps of:
    forming a thin film transistor including an oxide semiconductor layer over a substrate;
    placing the substrate provided with the thin film transistor including the oxide semiconductor layer in a tray body;
    placing a tray cover over the tray body so that the substrate provided with the thin film transistor including the oxide semiconductor layer is surrounded therein; and
    performing a heat treatment with the substrate provided with the thin film transistor including the oxide semiconductor layer surrounded with the tray body and the tray cover,
    wherein each of the tray body and the tray cover contains a conductive material,
    wherein a combination of the tray body and the tray cover constitutes a conductive storage container, and
    wherein at least one of the tray body and the tray cover has a depressed surface which has a larger area than the substrate.

4. The method for manufacturing a semiconductor device according to claim 3, wherein a temperature of the heat treatment is 100° C. to 300° C.

5. The method for manufacturing a semiconductor device according to claim 3, wherein a heating apparatus for performing the heat treatment is electrically connected to a ground potential and the conductive storage container is electrically connected to the ground potential.

6. A method for removing electricity, comprising the steps of:
    wrapping a substrate provided with a thin film transistor in metal foil; and
    performing a heat treatment to suppress presence of a static charge at a surface of the substrate provided with the thin film transistor or suppress generation of a static charge which is caused by wind.

7. A method for manufacturing a semiconductor device, comprising the steps of:
    forming a thin film transistor including an oxide semiconductor layer over a substrate; and
    performing a heat treatment with the substrate provided with the thin film transistor wrapped in conductive metal foil.

8. The method for manufacturing a semiconductor device according to claim 7, wherein a temperature of the heat treatment is 100° C. to 300° C.

9. The method for manufacturing a semiconductor device according to claim 7, wherein a heating apparatus for performing the heat treatment is electrically connected to a ground potential and the conductive metal foil is electrically connected to the ground potential.

* * * * *